United States Patent
Huang et al.

(10) Patent No.: US 12,334,475 B2
(45) Date of Patent: *Jun. 17, 2025

(54) 3D TRENCH CAPACITOR FOR INTEGRATED PASSIVE DEVICES

(71) Applicant: Taiwan Semiconductor Manufacturing Company, Ltd., Hsin-Chu (TW)

(72) Inventors: Xin-Hua Huang, Xihu Township (TW); Chung-Yi Yu, Hsin-Chu (TW); Yeong-Jyh Lin, Caotun Township (TW); Rei-Lin Chu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 63 days.

This patent is subject to a terminal disclaimer.

(21) Appl. No.: 18/512,092

(22) Filed: Nov. 17, 2023

(65) Prior Publication Data

US 2024/0088103 A1    Mar. 14, 2024

Related U.S. Application Data

(63) Continuation of application No. 17/555,969, filed on Dec. 20, 2021, now Pat. No. 11,862,612, which is a
(Continued)

(51) Int. Cl.
*H01L 25/065* (2023.01)
*H01L 21/768* (2006.01)
(Continued)

(52) U.S. Cl.
CPC .... *H01L 25/0657* (2013.01); *H01L 21/76898* (2013.01); *H01L 23/481* (2013.01);
(Continued)

(58) Field of Classification Search
CPC ........... H01L 25/0657; H01L 21/76898; H01L 23/481; H01L 23/528; H01L 24/08;
(Continued)

(56) References Cited

U.S. PATENT DOCUMENTS 11,211,362 B2    12/2021    Huang et al.
11,862,612 B2 *   1/2024    Huang ................... H01L 24/08
(Continued)

FOREIGN PATENT DOCUMENTS

KR    20080043139 A    5/2008

OTHER PUBLICATIONS

Non-Final Office Action dated May 13, 2021 for U.S. Appl. No. 16/824,908.
(Continued)

*Primary Examiner* — Herve-Louis Y Assouman
(74) *Attorney, Agent, or Firm* — Eschweiler & Potashnik, LLC

(57) ABSTRACT

Various embodiments of the present disclosure are directed towards a three-dimensional (3D) trench capacitor, as well as methods for forming the same. In some embodiments, a first substrate overlies a second substrate so a front side of the first substrate faces a front side of the second substrate. A first trench capacitor and a second trench capacitor extend respectively into the front sides of the first and second substrates. A plurality of wires and a plurality of vias are stacked between and electrically coupled to the first and second trench capacitors. A first through substrate via (TSV) extends through the first substrate from a back side of the first substrate, and the wires and the vias electrically couple the first TSV to the first and second trench capacitors. The first and second trench capacitors and the electrical coupling therebetween collectively define the 3D trench capacitor.

20 Claims, 27 Drawing Sheets

Related U.S. Application Data continuation of application No. 16/824,908, filed on Mar. 20, 2020, now Pat. No. 11,211,362.

(51) Int. Cl.

| | |
|---|---|
| *H01L 23/00* | (2006.01) |
| *H01L 23/48* | (2006.01) |
| *H01L 23/528* | (2006.01) |
| *H01L 23/538* | (2006.01) |
| *H01L 25/00* | (2006.01) |
| *H01L 25/03* | (2006.01) |
| *H10D 1/68* | (2025.01) |
| *H10D 84/00* | (2025.01) |
| *H10D 84/03* | (2025.01) |
| *H10D 86/85* | (2025.01) |

(52) U.S. Cl.
CPC ............ *H01L 23/528* (2013.01); *H01L 24/08* (2013.01); *H01L 24/80* (2013.01); *H01L 25/50* (2013.01); *H10D 86/85* (2025.01); *H01L 2224/80895* (2013.01); *H01L 2224/80896* (2013.01); *H01L 2224/80905* (2013.01); *H01L 2225/06541* (2013.01)

(58) Field of Classification Search
CPC ......... H01L 24/80; H01L 25/50; H01L 27/01; H01L 2224/80895; H01L 2224/80896; H01L 2224/80905; H01L 2225/06541; H01L 2224/0401; H01L 2224/056; H01L 2224/131; H01L 27/0688; H01L 2224/08145; H01L 2224/09181; H01L 2224/73251; H01L 2224/8001; H01L 2224/80013; H01L 2224/80357; H01L 2224/80365; H01L 2224/80379; H01L 2224/80948; H01L 27/0805; H01L 28/90; H01L 21/76895; H01L 21/822; H01L 23/5384; H01L 23/5386; H01L 28/40; H01L 24/05; H01L 25/03
See application file for complete search history.

(56) References Cited

U.S. PATENT DOCUMENTS

| | | |
|---|---|---|
| 2011/0089572 A1 | 4/2011 | Tezcan et al. |
| 2012/0126425 A1 | 5/2012 | Farooq et al. |
| 2012/0193785 A1 | 8/2012 | Lin et al. |
| 2012/0248621 A1 | 10/2012 | Sadaka |
| 2013/0164905 A1 | 6/2013 | Yang et al. |
| 2014/0264929 A1 | 9/2014 | Tsai et al. |
| 2014/0327109 A1 | 11/2014 | Weng et al. |
| 2015/0243611 A1 | 8/2015 | Liu et al. |
| 2016/0095221 A1 | 3/2016 | Ramachandran et al. |
| 2017/0092650 A1 | 3/2017 | Chen et al. |
| 2017/0186732 A1 | 6/2017 | Chu et al. |
| 2017/0186837 A1 | 6/2017 | Yen et al. |
| 2018/0082964 A1 | 3/2018 | Wu et al. |
| 2019/0198481 A1 | 6/2019 | Lee |
| 2020/0091063 A1 | 3/2020 | Chen et al. |

OTHER PUBLICATIONS

Notice of Allowance dated Aug. 18, 2021 for U.S. Appl. No. 16/824,908.

Non-Final Office Action dated Jun. 8, 2023 for U.S. Appl. No. 17/555,969.

Notice of Allowance dated Sep. 19, 2023 for U.S. Appl. No. 17/555,969.

\* cited by examiner

US 12,334,475 B2

3D TRENCH CAPACITOR FOR INTEGRATED PASSIVE DEVICES

REFERENCE TO RELATED APPLICATIONS

This Application is a Continuation of U.S. application Ser. No. 17/555,969, filed on Dec. 20, 2021, which is a Continuation of U.S. application Ser. No. 16/824,908, filed on Mar. 20, 2020 (now U.S. Pat. No. 11,211,362, issued on Dec. 28, 2021). The contents of the above-referenced Patent Applications are hereby incorporated by reference in their entirety.

BACKGROUND

An integrated passive device (IPD) is a collection of one or more passive devices integrated on a semiconductor substrate. Passive devices may include, for example, capacitors, resistors, inductors, and so on. IPDs are formed using semiconductor manufacturing processes and are packaged as integrated circuits (ICs). This leads to reduced size, reduced cost, and increased functional density compared to discrete passive devices. IPDs find application with, among things, mobile devices and application processors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
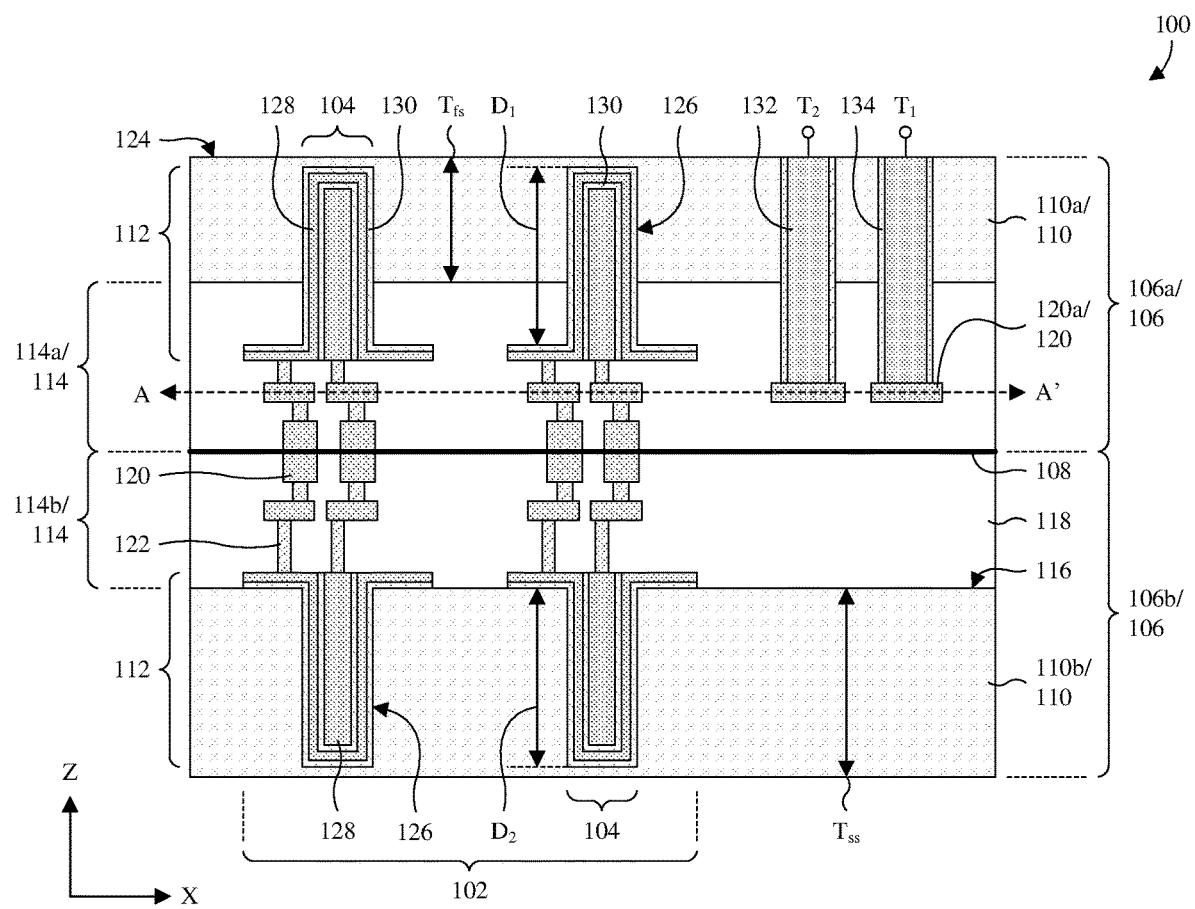
FIG. 1 illustrates a cross-sectional view of some embodiments of a semiconductor structure in which a three-dimensional (3D) trench capacitor has trench segments electrically coupled together by hybrid bonding.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated passive device (IPD) comprises a single monolithic semiconductor substrate and a trench capacitor embedded in the substrate. The trench capacitor comprises a plurality of capacitor electrodes and a plurality of capacitor dielectric layers. The capacitor electrodes and the capacitor dielectric layers are alternatingly stacked and define a trench segment extending or protruding into the substrate. Further, the capacitor electrodes are alternatingly and electrically coupled to a first terminal of the trench capacitor and a second terminal of the trench capacitor by wires and vias.

The IPD may be used for, among other things, mobile devices and access processors. Mobile devices and access processors continuously seek to scale down. As such, mobile devices and access processors continuously seek smaller and smaller IPDs. To decrease the size of the IPD, the size of the trench capacitor may be decreased by increasing the capacitance density of the trench capacitor. The capacitance density corresponds to capacitance per unit area in a two-dimensional (2D) projection of the trench capacitor onto a horizontal or XY plane (e.g., a footprint of the trench capacitor). Capacitance density may be increased by increasing the depth of the trench segment (e.g., how deep the trench segment extends into the substrate) in a vertical or Z dimension. However, semiconductor manufacturing processes used to form the IPD may limit the depth and may hence limit the capacitance density.

Increasing the depth of the trench segment increases an aspect ratio of the trench segment (e.g., a ratio of height to width) and hence increases an aspect ratio of a trench within which the trench segment is formed. At high aspect ratios, material may cluster around top corners of the trench during deposition of layers from which the trench segment is formed. This phenomenon may be known as trench necking. The clustering may pinch off a top of the trench before the deposition completes. As such, a void may form in the trench. Further, some layers from which the trench segment is formed may be restricted to a top of the trench, which may decrease electrode surface area and may hence decrease the capacitor density.

Various embodiments of the present disclosure are directed towards a three-dimensional (3D) trench capacitor for IPDs, as well as a method for forming the 3D trench capacitor. In some embodiments, a semiconductor structure in which the 3D trench capacitor is arranged includes a first IC die, a second IC die, and a pair of through substrate vias (TSVs). The first IC die includes a first substrate, a first interconnect structure underlying the first substrate, and a first trench capacitor. The first trench capacitor extends into the first substrate and is between the first substrate and the first interconnect structure. The second IC die is under and directly bonded to the first IC die. Further, the second IC die includes a second substrate, a second interconnect structure overlying the second substrate, and a second trench capacitor. The second trench capacitor extends into the second substrate and is between the second substrate and the second interconnect structure. The first and second trench capacitors collectively define the 3D trench capacitor. The TSVs extend through the first substrate and are electrically coupled to the first and second trench capacitors by the first and second interconnect structures.

The bonding may space the first and second trench capacitors in a vertical or Z dimension. As such, a two-dimensional projection of the 3D trench capacitor onto a horizontal or XY plane may occupy a small area. In other words, the 3D trench capacitor may have a small footprint. Further, the bonding and/or the TSVs may electrically couple the first and second trench capacitors in parallel so a capacitance of the 3D trench capacitor is a sum of the individual capacitances of the first and second trench capacitors. Because the capacitance of the 3D trench capacitor may be a sum of the capacitances of multiple trench capacitors, the 3D trench capacitor may have a high capacitance. As a result of the high capacitance and the small footprint, the 3D trench capacitor may have a high capacitance density. That is to say, a capacitance per unit area in the footprint of the 3D trench capacitor may be high.

With reference to FIG. 1, a cross-sectional view 100 of some embodiments of a semiconductor structure is provided in which a 3D trench capacitor 102 is arranged. The semiconductor structure may, for example, be an integrated circuit (IC), an IPD, or some other suitable semiconductor structure. The 3D trench capacitor 102 comprises a plurality of trench segments 104 spread across a plurality of IC dies 106, and the IC dies 106 are hybrid bonded together at a front side bond interface 108. The front side bond interface 108 includes both a metal-to-metal bond and a dielectric-to-dielectric.

The plurality of IC dies 106 comprises a first IC die 106a and a second IC die 106b underlying the first IC die 106a. The IC dies 106 comprise corresponding substrates 110, corresponding device layers 112, and corresponding interconnect structures 114. The device layers 112 and the interconnect structures 114 are respectively on front sides 116 of the substrates 110. The substrates 110 may, for example, be bulk monocrystalline silicon substrates or some other suitable semiconductor substrates. The device layers 112 are levels of devices in a vertical or Z dimension. The interconnect structures 114 directly contact at the front side bond interface 108 and surround and electrically couple to the device layers 112.

The interconnect structures 114 comprise corresponding interconnect dielectric layers 118, corresponding wires 120, and corresponding vias 122. The wires 120 and the vias 122 are alternatingly stacked in the interconnect dielectric layers 118 to define conductive paths from the trench segments 104 to the front side bond interface 108. The interconnect dielectric layers 118 may be or comprise, for example, silicon oxide, silicon nitride, silicon oxynitride, a low k dielectric, some other suitable dielectric(s), or any combination of the foregoing. In some embodiments, the interconnect dielectric layers 118 are or comprise silicon oxide and/or silicon oxynitride at the front side bond interface 108. Other suitable dielectric(s) are, however, amenable. The wires 120 and the vias 122 may be or comprise, for example, metal and/or some other suitable conductive material(s).

The trench segments 104 are spread across the device layers 112. Further, the trench segments 104 extend or protrude respectively into the front sides 116 of the substrates 110 respectively towards back sides 124 of the substrates 110. The trench segments 104 individually define two-dimensional (2D) trench capacitors 126. A 2D trench capacitor is a trench capacitor limited to a single device layer, whereas a 3D trench capacitor is a trench capacitor spanning multiple device layers. The 2D trench capacitors 126 are electrically coupled in parallel by the wires 120 and the vias 122, such that a capacitance of the 3D trench capacitor 102 is a sum of the capacitances of the 2D trench capacitors 126.

Because the trench segments 104 are spread across multiple device layers (e.g., the device layers 112 of the first and second IC dies 106a, 106b) in the vertical or Z dimension, a 2D projection of the 3D trench capacitor 102 onto a horizontal or XY plane may occupy a small area. In other words, the 3D trench capacitor 102 may have a small footprint. Further, because the capacitance of the 3D trench capacitor 102 is a sum of the capacitances of multiple 2D trench capacitors (e.g., the sum of the capacitances of the 2D trench capacitors 126), the 3D trench capacitor 102 may have a high capacitance. As a result of the high capacitance and the small footprint, the 3D trench capacitor 102 may have a high capacitance density. That is to say, a capacitance per unit area in the footprint of the 3D trench capacitor 102 may be high.

In some embodiments, the 3D trench capacitor 102 has a capacitance density that is about 30% or more higher, about 50% or more higher, or some other suitable percentage higher than a maximum capacitance density for a 2D trench capacitor. In some embodiments, a maximum capacitance density for a 2D trench capacitor is about 850 nanofarad, about 1100 nanofarad, or some other suitable value.

With continued reference to FIG. 1, the trench segments 104 are defined by corresponding capacitor electrodes 128 and corresponding capacitor dielectric layers 130. The capacitor electrodes 128 are alternatingly stacked with the capacitor dielectric layers 130, such that the capacitor dielectric layers 130 separate the capacitor electrodes 128 from each other and from the substrates 110. The capacitor electrodes 128 may be or comprise, for example, metal, doped polysilicon, some other suitable conductive material(s), or any combination of the foregoing. The capacitor dielectric layers 130 may be or comprise, for example, silicon oxide, a high k dielectric, some other suitable dielectric(s), or any combination of the foregoing.

Notwithstanding that the trench segments 104 are illustrated as each being defined by two capacitor electrodes and two capacitor dielectric layers, additional capacitor electrodes and/or additional capacitor dielectric layers are amenable. Further, notwithstanding that four trench segments are illustrated, more or less trench segments are amenable. For example, there may be three trench segments on each of the IC dies 106. Further yet, notwithstanding that the IC dies 106 have the same number of trench segments, different numbers of trench segments are amenable. For example, the first IC die 106a may have three trench segments, whereas the second IC die 106b may have two or four trench segments.

TSVs 132 extend through the substrate 110 of the first IC die 106a (e.g., the first substrate 110a) to TSV wires 120a in the interconnect structure 114 of the first IC die 106a (e.g., the first interconnect structure 114a). While not fully visible, the TSV wires 120a electrically couple the TSVs 132 to a remainder of the wires 120 and a remainder of the vias 122, which electrically couple the TSV wires 120a (and hence the TSVs 132) respectively to terminals of the 3D trench capacitor 102. In some embodiments, the TSVs 132 are electrically coupled to the 2D trench capacitors 126 of the second IC die 106b and/or the 2D trench capacitors of the first IC die 106a only through the TSV wires 120a. The TSVs 132 respectively provide access to a first terminal T1 of the 3D trench capacitor 102 and a second terminal $T_2$ of the 3D trench capacitor 102 from the back side 124 of the first substrate 110a. The TSVs 132 are separated from the first substrate 110a by corresponding TSV dielectric layers 134 and may be or comprise, for example, metal and/or some other suitable conductive material(s). The TSV dielectric layers 134 may be or comprise, for example, silicon oxide, silicon nitride, some other suitable dielectric(s), or any combination of the foregoing.

The first and second terminals $T_1$, $T_2$ of the 3D trench capacitor 102 may respectively be an anode of the 3D trench capacitor 102 and a cathode of the 3D trench capacitor 102 or vice versa. In some embodiments, the first and second terminals $T_1$, $T_2$ are respectively and electrically coupled to a power supply voltage (e.g., $V_{DD}$) and ground, or vice versa, during use of the 3D trench capacitor 102. In other embodiments, the first and second terminals $T_1$, $T_2$ are electrically coupled to some other suitable voltages.

The trench segments 104 of the first IC die 106a have a first depth $D_1$, and the trench segments 104 of the second IC die 106b have a second depth $D_2$. A portion of the first depth $D_1$ is in the first interconnect structure 114a and a remainder of the first depth $D_1$ is in the first substrate 110a. Further, the second depth $D_2$ is wholly or substantially in the substrate 110 of the second IC die 106b (e.g., the second substrate 110b). As such, the trench segments 104 of the first IC die 106a laterally contact the first interconnect structure 114a, whereas the trench segments 104 of the second IC die 106b do not laterally contact the interconnect structure 114 of the second IC die 106b (e.g., the second interconnect structure 114b). In some embodiments, the interconnect dielectric layer 118 of the first interconnect structure 114a is or comprises silicon oxide and/or some other suitable oxide(s) at the trench segments 104 of the first IC die 106a. Other suitable dielectric(s) is/are, however, amenable.

Because a portion of the first depth $D_1$ is in the first interconnect structure 114a, the first depth $D_1$ may be larger than it would be if wholly or substantially in the first substrate 110a. As such, the 2D trench capacitors 126 of the first IC die 106a may have larger capacitances than they would otherwise have. Further, because the TSVs 132 are formed in the first substrate 110a, process limits (discussed in detail hereafter) while forming the TSVs 132 may limit a thickness $T_{fs}$ of the first substrate 110a to a small value. For example, the first thickness $T_{fs}$ may be small relative to a second thickness $T_{ss}$ of the second substrate 110b. Therefore, if the first depth $D_1$ was wholly or substantially in the first substrate 110a, the first depth $D_1$ may be small. However, because a portion of the first depth $D_1$ is in first interconnect structure 114a, the negative effects from the small thickness are mitigated and the 2D trench capacitors 126 may have high capacitances. For example, the first depth $D_1$ may be the same as or larger than the second depth $D_2$ and/or the 2D trench capacitors 126 of the first IC die 106a may have the same or larger capacitances as the 2D trench capacitors 126 of the second IC die 106b.

In some embodiments, the first depth $D_1$ is about 4 micrometers or less, about 6 micrometers or less, about 8 micrometers or less, about 4-8 micrometers, or some other suitable value. In some embodiments, the second depth $D_2$ is about 4 micrometers or less, about 6 micrometers or less, about 4-6 micrometers, or some other suitable value. If the first and second depths $D_1$, $D_2$ are too low (e.g., less than about 4 micrometers or some other suitable value), the capacitances of the 2D trench capacitors 126 may be low and hence the capacitance density of the 3D trench capacitor 102 may be low. If the first and second depths $D_1$, $D_2$ are too high (e.g., greater than about 6 micrometers, 8 micrometers, or some other suitable value), aspect ratios of trenches within which the trench segments 104 are formed may be high. In some embodiments, the portion of the first depth $D_1$ in the first interconnect structure 114a is about equal to, or within about 5 percent, 10 percent, 20 percent, or some other suitable percentage of, a difference between the first and second thicknesses $T_{fs}$, $T_{ss}$. In some embodiments, the portion of the first depth $D_1$ in the first interconnect structure 114a is 20-60 percent, about 20-40 percent, about 40-60 percent, or some other suitable percentage of the first depth $D_1$. If the portion of the first depth $D_1$ in the first interconnect structure 114a makes up too small a percentage of the first depth $D_1$ (e.g., less than about 20 percent or some other suitable value), increased manufacturing costs may not outweigh the benefit from increased capacitance.

At high aspect ratios, material may cluster around top corners of the trenches during deposition of layers from which the trench segments 104 are formed. This phenomenon may be known as trench necking. The clustering may pinch off tops of the trenches before the deposition completes. As such, voids may form in the trenches. Further, some layers from which the trench segments 104 are formed may be restricted to tops of the trenches, which may decrease electrode surface area and may hence decrease the capacitor density.

Figure 2:
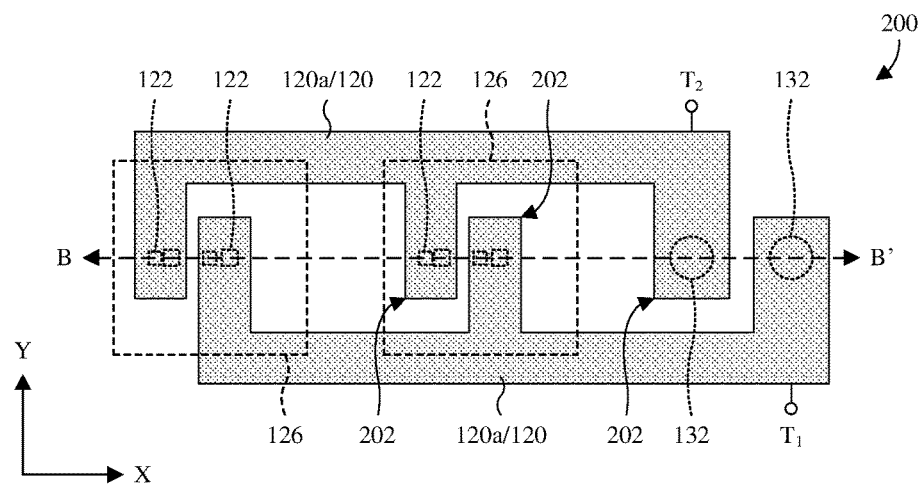
FIG. 2 illustrates a top layout of some embodiments of wires electrically coupling through substrate vias (TSVs) of FIG. 1 to the 3D trench capacitor of FIG. 1.

With reference to FIG. 2, a top layout 200 of some embodiments of the TSV wires 120a of FIG. 1 is provided. Additionally, for illustrative purposes, the TSVs 132, the 2D trench capacitors 126, and some of the vias 122 are shown in phantom. The top layout 200 of FIG. 2 may, for example, be taken along line A-A' in FIG. 1 and/or the cross-sectional view 100 of FIG. 1 may, for example, be taken along line B-B' in FIG. 2.

The TSV wires 120a include corresponding fingers 202 that are interdigitated. In some embodiments, the TSV wires 120a are minor images of each other. The TSV wires 120a directly and respectively contact the TSVs 132 and some of the vias 122 respectively at the fingers 202 to electrically couple the TSVs 132 respectively to the vias. The wires 120, including the TSV wires 120a, and the vias 122 define conductive paths leading from the TSVs 132 respectively to terminals of the 2D trench capacitors 126 to electrically couple the 2D trench capacitors 126 to the TSVs 132. Further, as noted above, the wires 120 and the vias 122 electrically couple the 2D trench capacitors 126 in parallel with each other. Notwithstanding the specific top layouts shown for the TSV wires 120a, the 2D trench capacitors 126, the TSVs 132, and some of the vias 122, it is to be appreciated that other top layouts are amenable.

Figure 3:
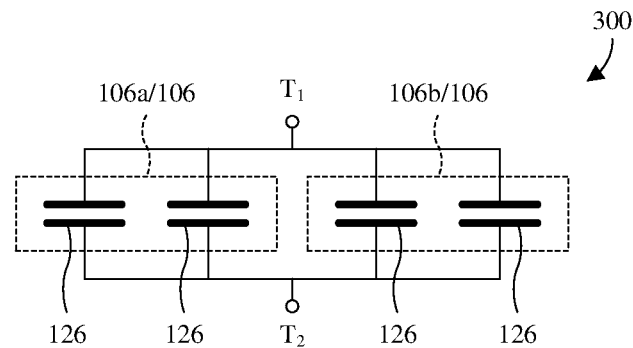
FIG. 3 illustrates a circuit diagram of some embodiments of the 3D trench capacitor of FIG. 1.

With reference to FIG. 3, a circuit diagram 300 of some embodiments of the 3D trench capacitor 102 of FIG. 1 is provided. The 2D trench capacitors 126 are electrically coupled in parallel from the first terminal $T_1$ of the 3D trench capacitor 102 to the second terminal $T_2$ of the 3D trench capacitor 102. Further, the 2D trench capacitors 126 are grouped by IC die.

Figure 4A:
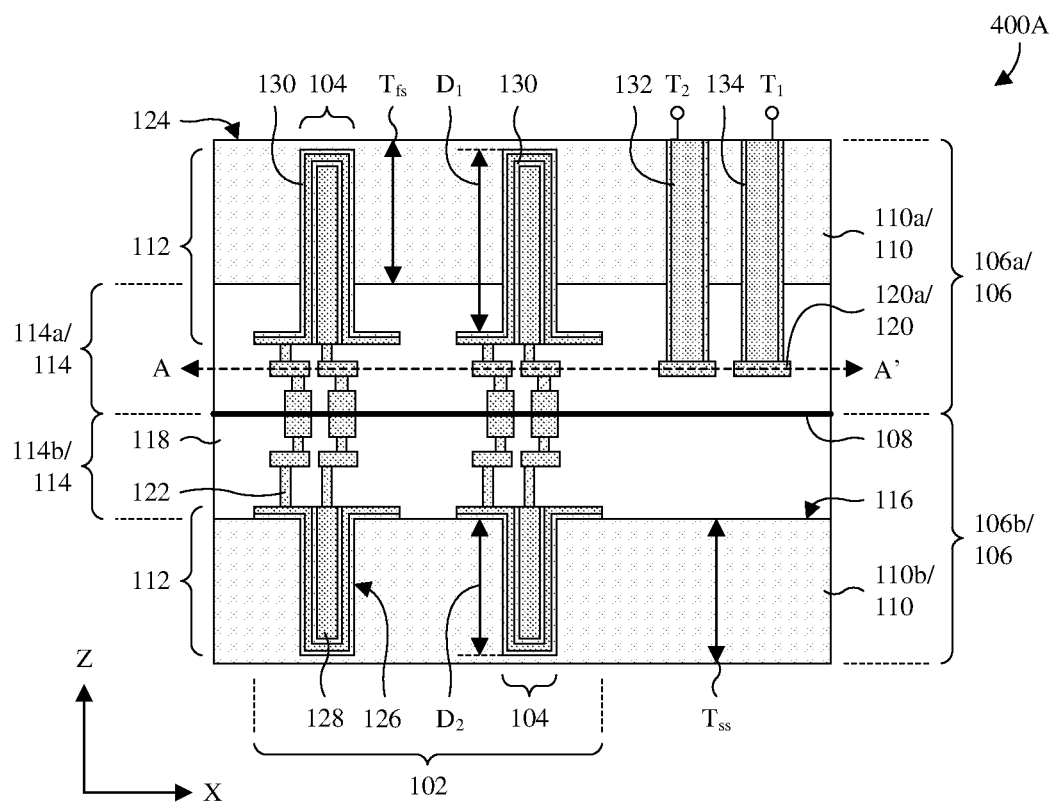
FIGS. 4A-4E illustrate cross-sectional views of various alternative embodiments of the semiconductor structure of FIG. 1 in which the trench segments are varied.

With reference to FIG. 4A, a cross-sectional view 400A of some alternative embodiments of the semiconductor structure of FIG. 1 is provided in which the first and second thicknesses $T_{fs}$, $T_{ss}$ respectively of the first and second substrates 110a, 110b are the same or substantially the same. Further, the first depth $D_1$ is greater than the second depth $D_2$.

Figure 4B:
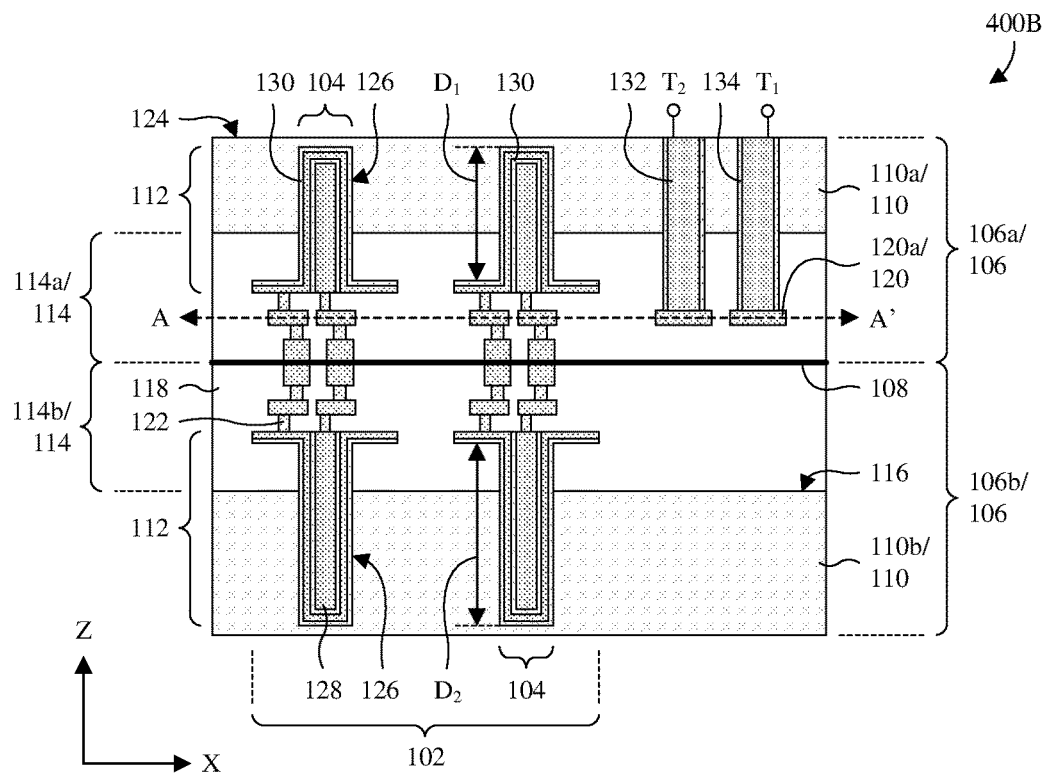

With reference to FIG. 4B, a cross-sectional view 400B of some alternative embodiments of the semiconductor structure of FIG. 1 is provided in which a portion of the second depth $D_2$ is in the second interconnect structure 114b. As such, the trench segments 104 of the second IC die 106b laterally contact the second interconnect structure 114b. Because a portion of the first depth $D_2$ is in the second interconnect structure 114b, the second depth D 2 may be larger than it would be if wholly or substantially in the second substrate 110b. As such, the 2D trench capacitors 126 of the second IC die 106b may have larger capacitances.

Figure 4C:
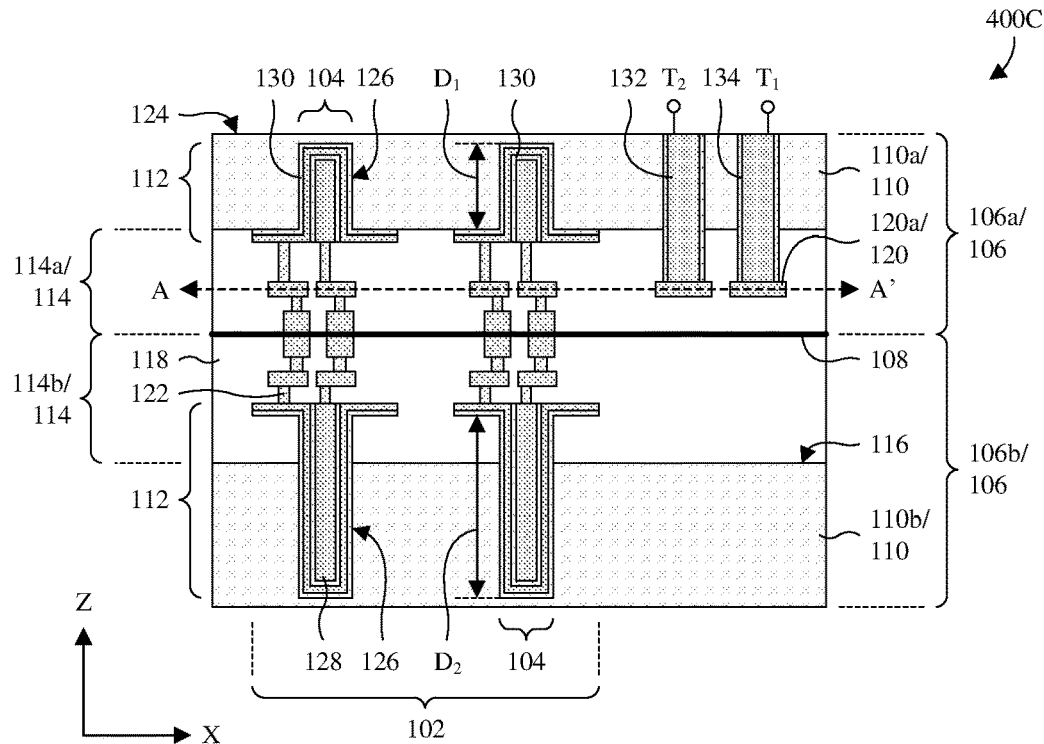

With reference to FIG. 4C, a cross-sectional view 400C of some alternative embodiments of the semiconductor structure of FIG. 1 is provided in which the first depth $D_1$ is wholly or substantially in the first substrate 110a. Further, a portion of the second depth $D_2$ is in the second interconnect structure 114b. As such, the trench segments 104 of the second IC die 106b laterally contact the second interconnect structure 114b, but the trench segments 104 of the first IC die 106a do not laterally contact the first interconnect structure 114a.

Figure 4D:
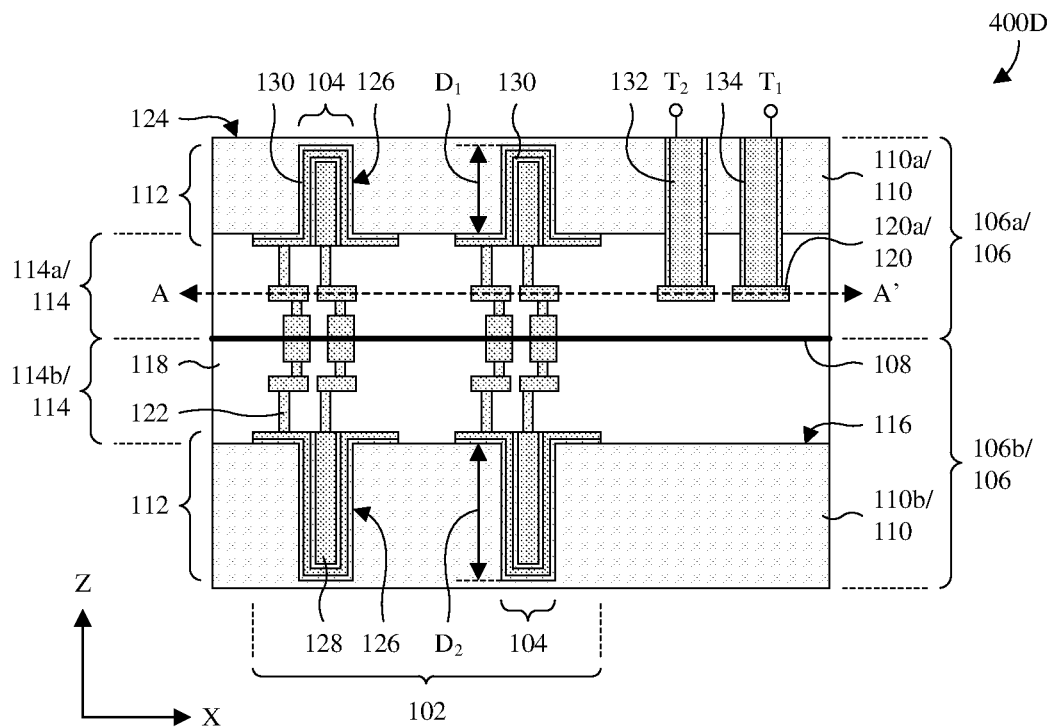

With reference to FIG. 4D, a cross-sectional view 400D of some alternative embodiments of the semiconductor structure of FIG. 1 is provided in which the first depth $D_1$ is wholly or substantially in the first substrate 110a. As such, the trench segments 104 of the first IC die 106a do not laterally contact the first interconnect structure 114a.

Figure 4E:
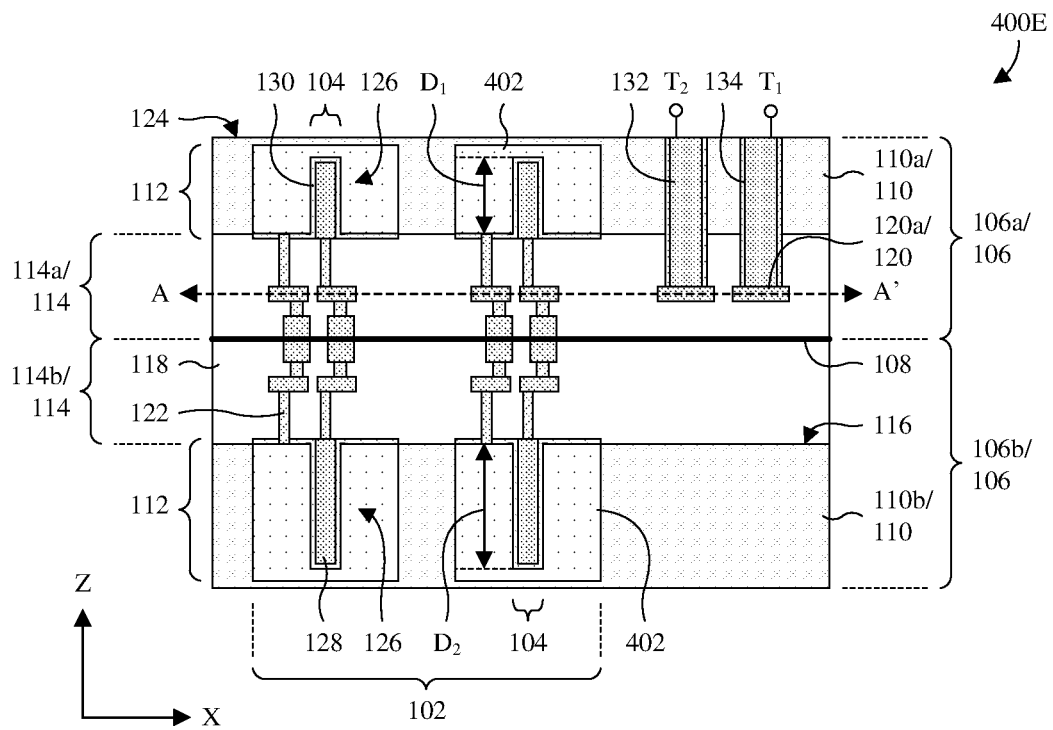

With reference to FIG. 4E, a cross-sectional view 400E of some alternative embodiments of the semiconductor structure of FIG. 4D is provided in which some of the capacitor dielectric layers 130 are omitted and some of the capacitor electrodes 128 are omitted. Further, the 2D trench capacitors 126 have corresponding well regions 402 in the substrates 110. The well regions 402 are doped regions of the substrates 110 that line the trench segments 104 and that serve as capacitor electrodes. In some embodiments, the well regions 402 have opposite doping types (e.g., p-type vs. n-type) as adjoining regions of the substrates 110. The well regions 402 may also be known as substrate-type capacitor electrodes, whereas the capacitor electrodes 128 may also be known as in-trench-type capacitor electrodes.

While FIGS. 1 and 4A-4D are not illustrated with the well regions 402 of FIG. 4E, it is to be appreciated that alternative embodiments of FIGS. 1 and 4A-4D may include the well regions 402. Further, while the top layout 200 of FIG. 2 is described with regard to the cross-sectional view 100 of FIG. 1, the top layout 200 is applicable to the cross-sectional views 400A-400E of FIGS. 4A-4E. In other words, the top layout 200 of FIG. 2 may alternatively be taken along line A-A' in any one of FIGS. 4A-4E and/or the cross-sectional views 400A-400E of FIGS. 4A-4E may alternatively be taken along line B-B' in FIG. 2.

Figure 5A:
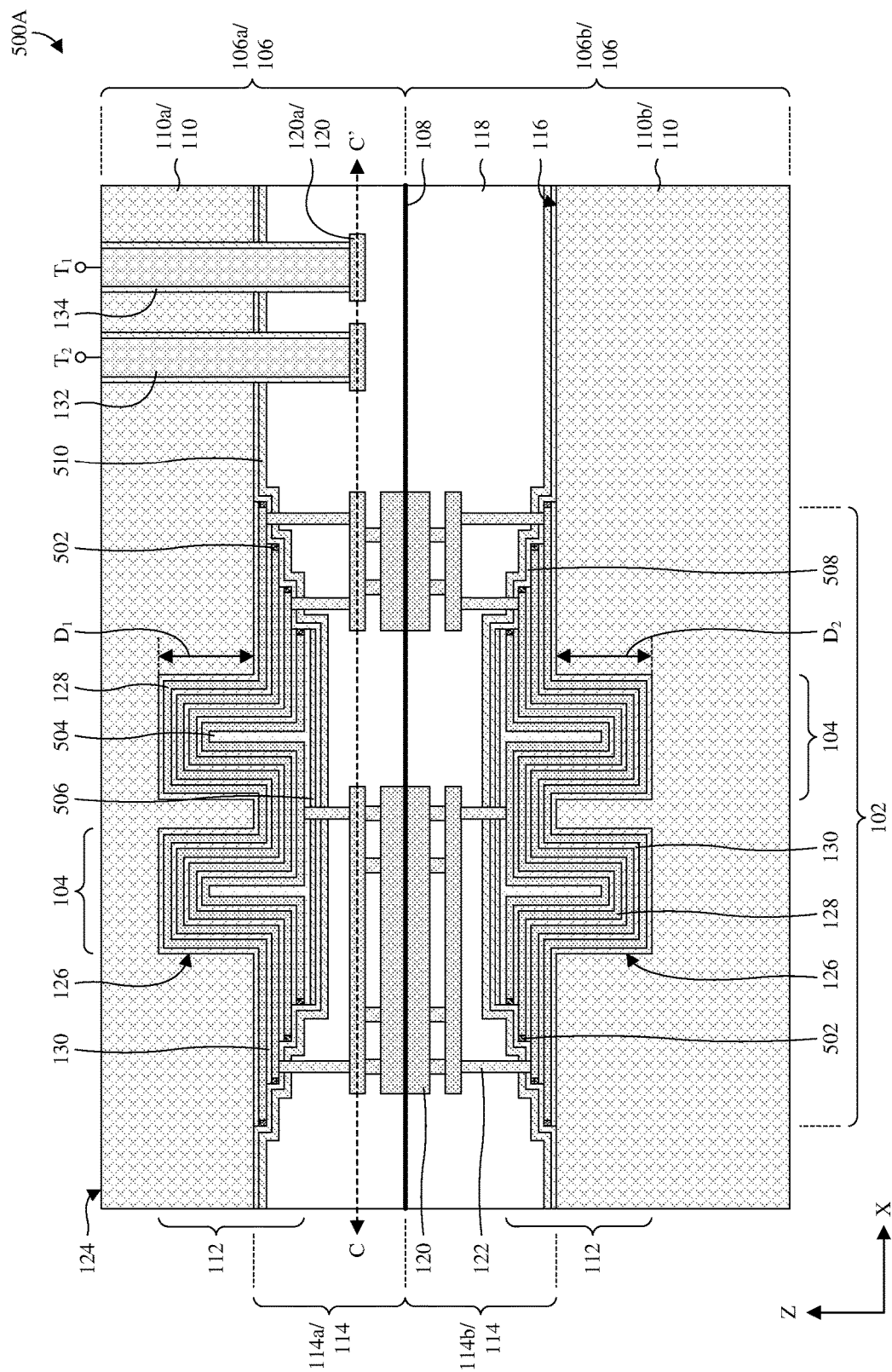
FIGS. 5A and 5B illustrate cross-sectional views of various alternative embodiments of the semiconductor structure of FIG. 1 in which the trench segments are defined by more capacitor electrodes than in FIG. 1.

With reference to FIG. 5A, a cross-sectional view 500A of some alternative embodiments of the semiconductor structure of FIG. 1 is provided in which there is a one-to-many correspondence between the 2D trench capacitors 126 and the trench segments 104. Additionally, the 2D trench capacitors 126 are defined by more capacitor electrodes and more capacitor dielectric layers than in FIG. 1. The capacitor electrodes 128 and the capacitor dielectric layers 130 are alternatingly and vertically stacked with widths decreasing towards the interconnect structures 114. Further, the capacitor electrodes 128 are electrically coupled so each of the 2D trench capacitors 126 may be modeled as multiple capacitors (e.g., a capacitor for each pair of neighboring capacitor electrodes) electrically coupled in parallel. The increased number of capacitor electrodes may, for example, increase capacitances of the 2D trench capacitors 126 and may hence increase a capacitance density of the 3D trench capacitor 102.

Sidewall spacers 502 are respectively on sidewalls of the capacitor electrodes 128. First capping layers 504 are between the substrates 110 protrude respectively into the 2D trench segments 104. Second capping layers 506 are between and respectively on the first capping layers 504. The sidewall spacers 502 may be or comprise, for example, silicon oxide, silicon nitride, some other suitable dielectric(s), or any combination of the foregoing. The first capping layers 504 may be or comprise, for example, silicon oxide, metal, some other suitable material(s), or any combination of the foregoing. The second capping layers 506 may be or comprise, for example, silicon nitride and/or some other suitable dielectric(s).

First etch stop layers (ESLs) 508 and second ESLs 510 are between the substrates 110 and are between the 2D trench capacitors 126. The first ESLs 508 respectively cover the substrates 110 and respectively cover the 2D trench capacitors 126 on the front sides 116 of the substrates 110. The second ESLs 510 respectively cover the first ESLs 508 on the front sides 116 of the substrates 110. The first ESLs 508 may be or comprise, for example, silicon oxide and/or some other suitable dielectric(s). The second ESLs 510 may be or comprise, for example, silicon nitride and/or some other suitable dielectric(s).

Figure 5B:
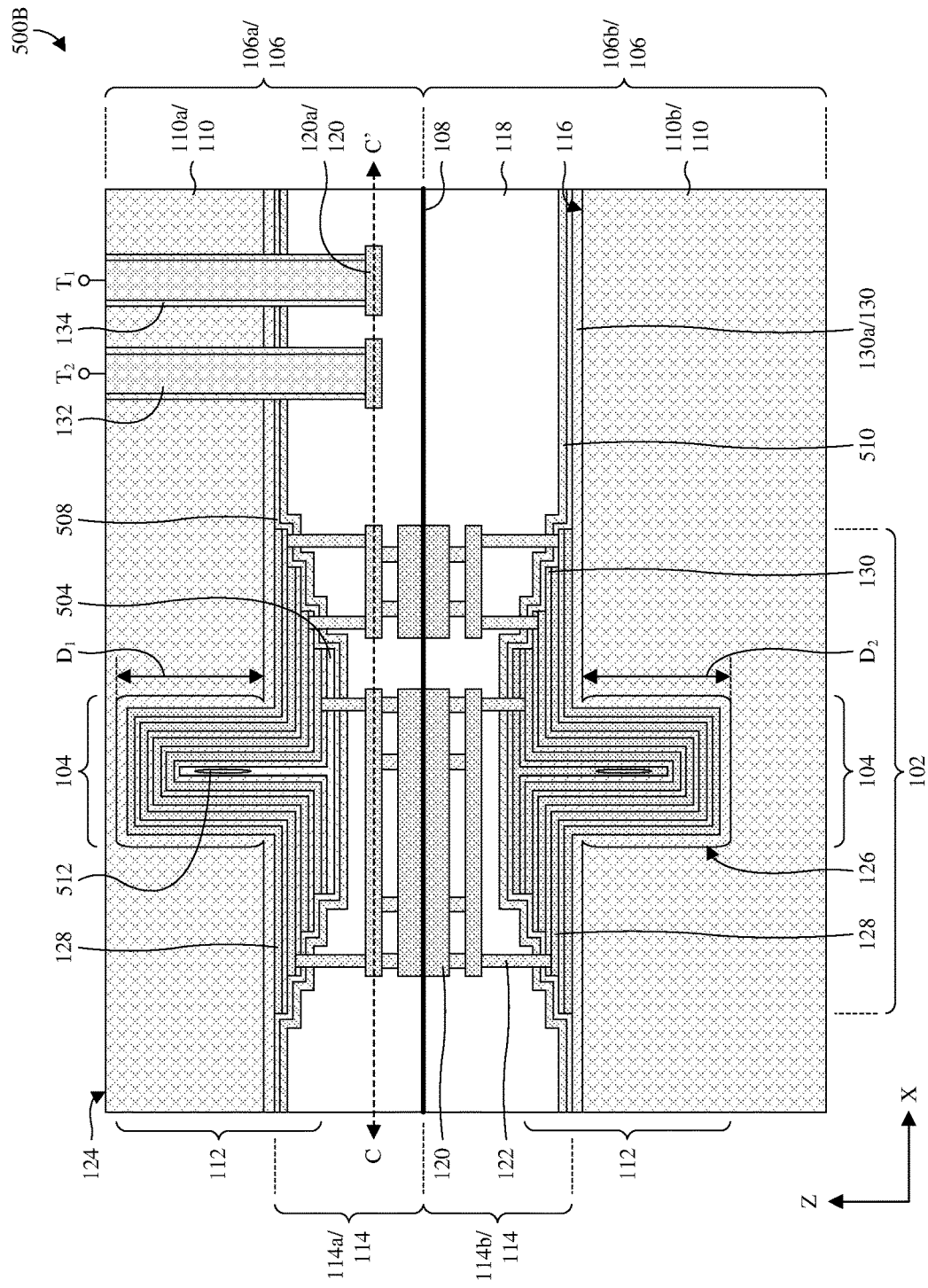

With reference to FIG. 5B, a cross-sectional view 500B of some alternative embodiments of the semiconductor structure of FIG. 5A is provided in which the 2D trench capacitors 126 are limited to a single trench segment. Further, capacitor dielectric layers 130a at the substrates 110 blanket the substrates 110 and have greater thicknesses than a remainder of the capacitor dielectric layers 130. Further yet, the sidewall spacers 502 and the second capping layer 506 are omitted and gaps 512 are at the trench segments 104 due to high aspect of the trench segments 104. In alternative embodiments, the semiconductor structure may include the sidewall spacers 502 as in FIG. 5A and/or may include the second capping layer 506 as in FIG. 5A. In alternative embodiments, the gaps 512 may be omitted.

While the trench segments 104 of FIGS. 5A and 5B are wholly or substantially in the substrates 110, respectively, one, some, or all of the trench segments 104 may be partially in the interconnect structures 114, respectively, as in FIGS. 1 and 4A-4C. For example, the trench segments 104 of the first IC die 104a may be partially in the first interconnect structure 114a as in FIG. 1 in alternative embodiments of FIGS. 5A and 5B.

Figure 6:
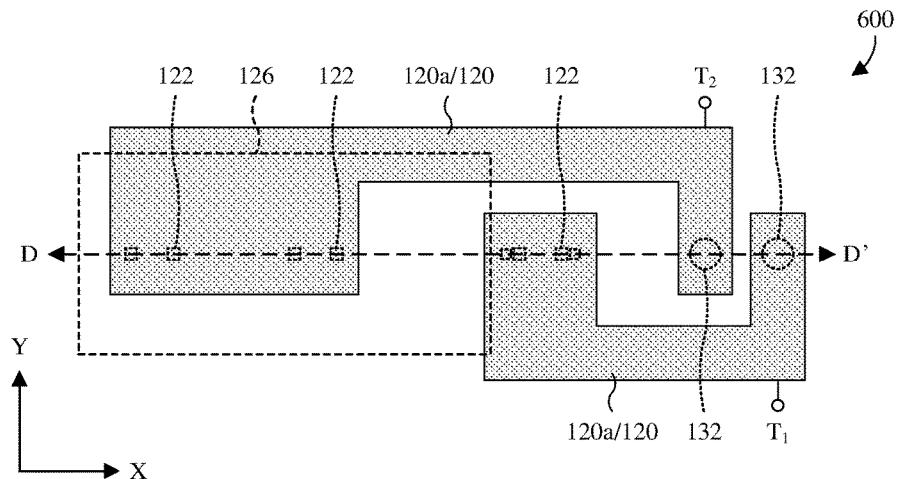
FIG. 6 illustrates a top layout of some embodiments of wires electrically coupling TSVs of FIG. 5A to the 3D trench capacitor of FIG. 5A.

With reference to FIG. 6, a top layout 600 of some embodiments of the TSV wires 120a of FIG. 5A is provided. Additionally, for illustrative purposes, the TSVs 132, the 2D trench capacitors 126, and some of the vias 122 are shown in phantom. The top layout 600 of FIG. 6 may, for example, be taken along line C-C' in FIG. 5A and/or the cross-sectional view 500A of FIG. 5A may, for example, be taken along line D-D' in FIG. 6. The TSV wires 120a wrap around each other and contact the TSVs 132 and some of the vias 122 to electrically couple the TSVs 132 respectively to the vias. The wires 120, including the TSV wires 120a, and the vias 122 define conductive paths leading from the TSVs 132 respectively to terminals of the 2D trench capacitors 126 to electrically couple the 2D trench capacitors 126 to the TSVs 132.

Despite the specific top layouts shown for the TSV wires 120a, the TSVs 132, and some of the vias 122, it is to be appreciated that other top layouts are amenable. Further, while the top layout 600 of FIG. 6 is described with regard to the cross-sectional view 500A of FIG. 5A, the top layout 600 is applicable to the cross-sectional view 500B of FIG. 5B. In other words, the top layout 600 of FIG. 6 may alternatively be taken along line C-C' in FIG. 5B and/or the cross-sectional view 500B of FIG. 5B may alternatively be taken along line D-D' in FIG. 6.

Figure 7:
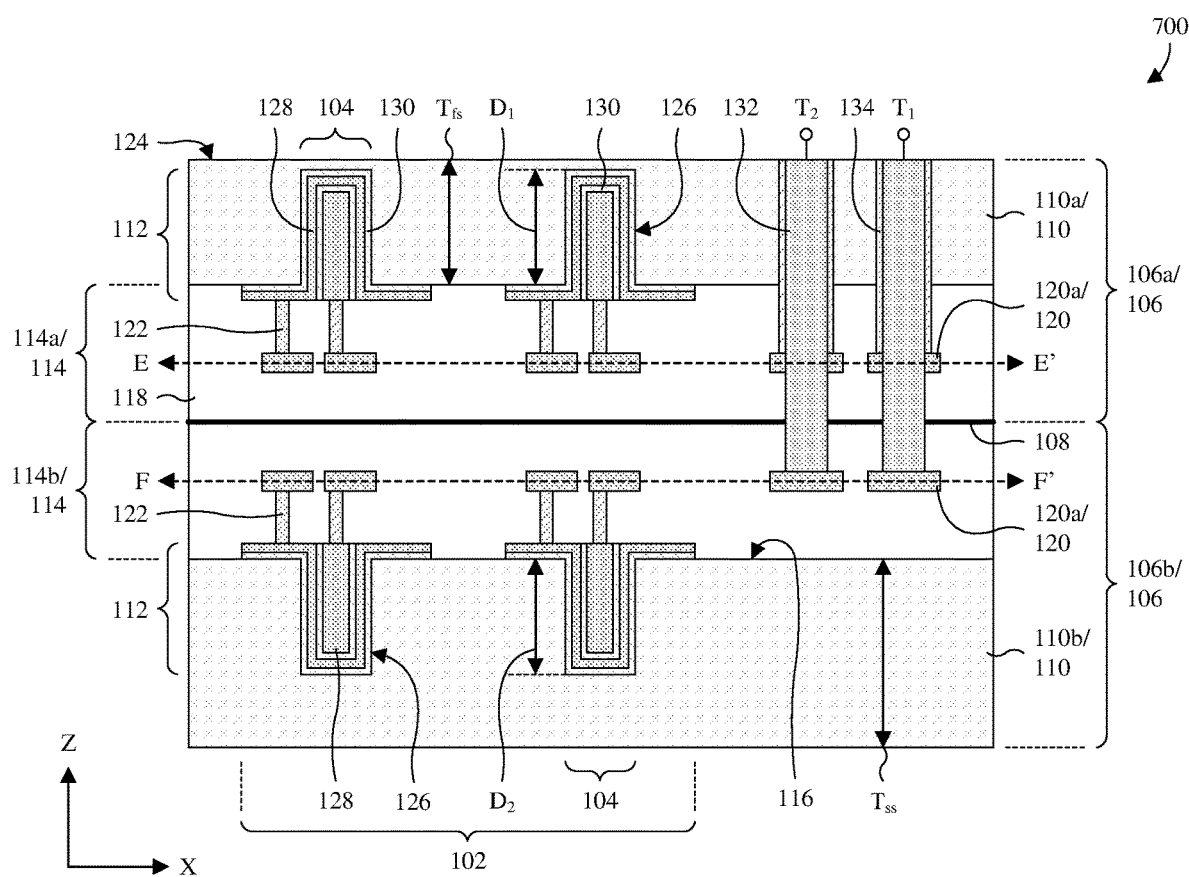
FIG. 7 illustrates a cross-sectional view of some alternative embodiments of the semiconductor structure of FIG. 1 in which the trench segments are electrically coupled together by TSVs instead of hybrid bonding.

With reference to FIG. 7, a cross-sectional view 700 of some alternative embodiments of the semiconductor structure of FIG. 1 is provided in which the IC dies 106 are fusion bonded together, instead of hybrid bonded together, at the front side bond interface 108. As such, there is no metal-to-metal bond at the front side bond interface 108. Further, the IC dies 106 comprise corresponding TSV wires 120a and the TSVs 132 electrically couple the 2D trench capacitors 126 in parallel through the TSV wires 120a. In alternative embodiments, there is a metal-to-metal bond at the front side bond interface 108, but it's not employed for electrically coupling the 2D trench capacitors 126 in parallel. In some embodiments, the interconnect dielectric layer 118 is or comprises silicon oxide and/or some other suitable oxide at the front side bond interface 108. Other suitable dielectric(s) are, however, amenable.

The TSVs 132 extend through the first IC die 106a and terminate in the second IC die 106b. At the first interconnect structure 114a, the TSVs 132 extend respectively through the TSV wires 120a of the first IC die 106a and laterally and directly contact the TSV wires. The TSV wires 120a of the first IC die 106a and the vias 122 of the first IC die 106a electrically couple the TSVs 132 respectively to terminals of the 2D trench capacitors 126 of the first IC die 106a. At the second interconnect structure 114b, the TSVs 132 terminate respectively at the TSV wires 120a of the second IC die 106b. The TSV wires 120a of the second IC die 106b and the vias 122 of the second IC die 106a electrically couple the TSVs 132 respectively to terminals the 2D trench capacitors 126 of the second IC die 106a.

In some embodiments, the 2D trench capacitors 126 of the first IC die 106a are electrically coupled to the 2D trench capacitors 126 of the second IC die 106b only through the TSVs 132. In other words, but for the TSVs 132, the 2D trench capacitors 126 of the first IC die 106a would be electrically separated from the 2D trench capacitors 126 of the second IC die 106b. In some embodiments, conductive paths from the 2D trench capacitors 126 of the first IC die 106a to the TSVs 132 are non-overlapping with conductive paths from the 2D trench capacitors 126 of the second IC die 106b to the TSVs 132.

By using fusion bonding in place of the hybrid bonding of FIG. 1, process difficulties with the hybrid bonding may be mitigated. The hybrid bonding may be more difficult to implement than the fusion bonding because it depends upon alignment between the wires at the front side bond interface 108 (see, e.g., FIG. 1) to electrically couple the IC dies 106 together, whereas the fusion bonding does not. On the other hand, by using the hybrid bonding of FIG. 1 in place of the fusion bonding, process difficulties with forming the TSVs 132 may be mitigated. The TSVs 132 terminate in the first interconnect structure 114a when using the hybrid bonding, so the TSVs 132 have lesser heights than when using the fusion bonding. These lesser heights reduce aspect ratios of via openings within which the TSVs 132 are formed and hence reduce the process difficulties with forming the TSVs 132.

Figure 8A:
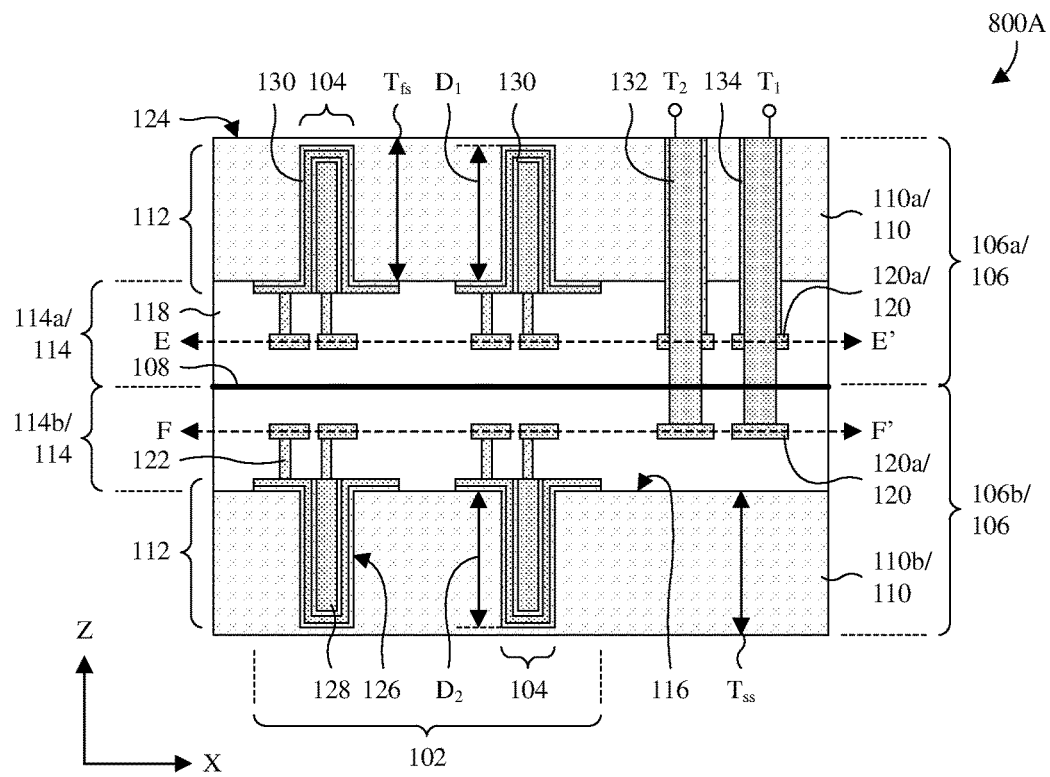
FIGS. 8A-8E illustrate cross-sectional views of various alternative embodiments of the semiconductor structure of FIG. 7 in which the trench segments are varied.
Figure 8B:
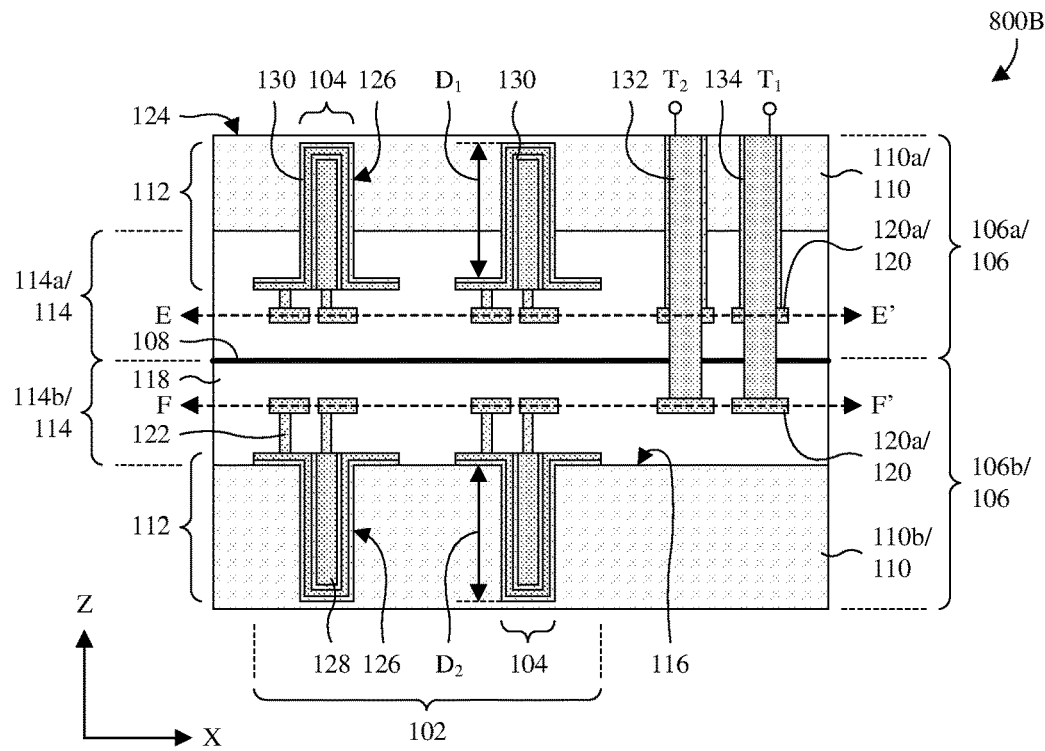
Figure 8C:
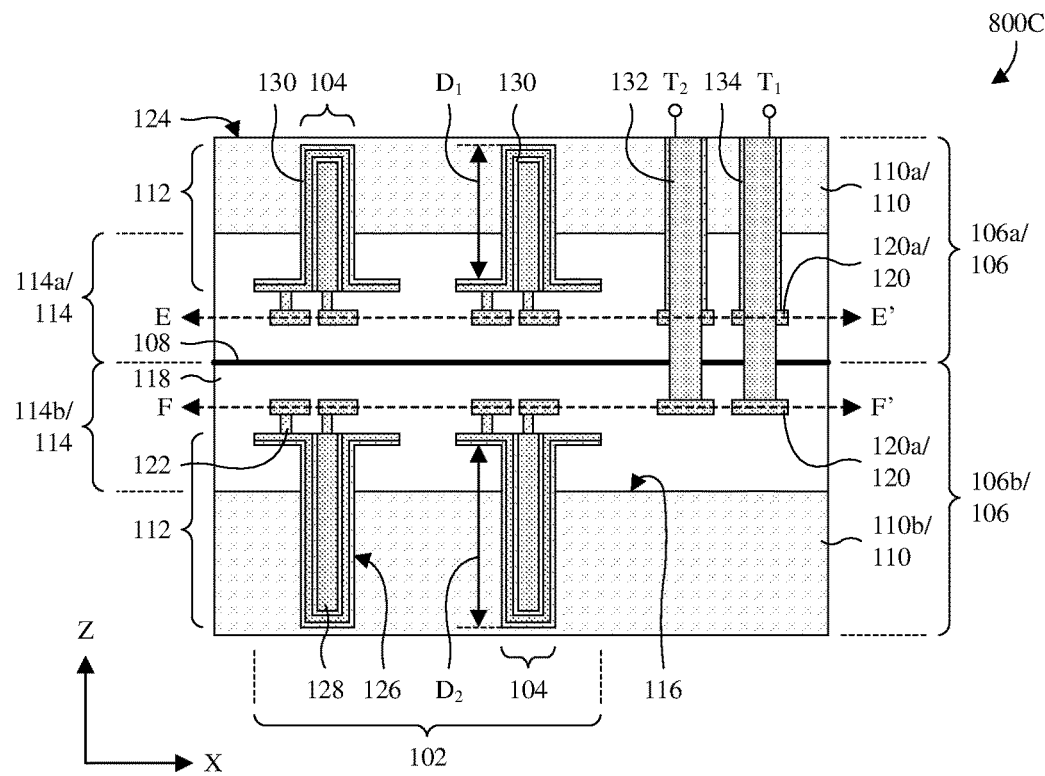
Figure 8D:
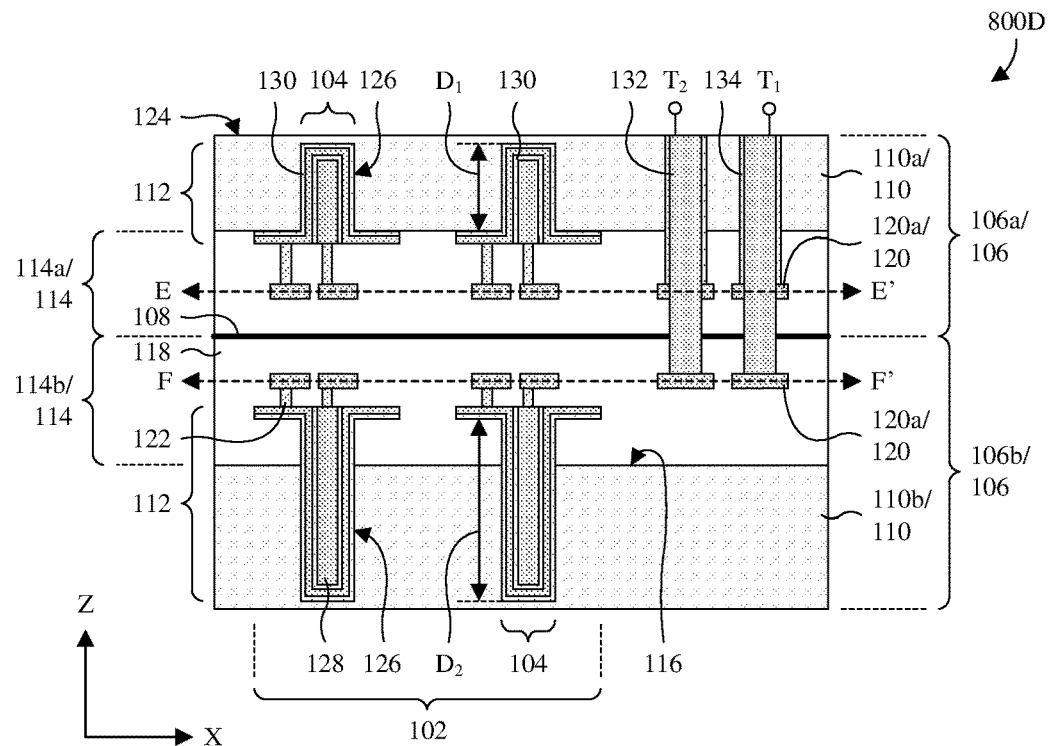

With reference to FIG. 8A, a cross-sectional view 800A of some alternative embodiments of the semiconductor structure of FIG. 7 is provided in which the first and second thicknesses $T_{fs}$, $T_{ss}$ respectively of the first and second substrates 110a, 110b are the same or substantially the same. With reference to FIGS. 8B-8E, cross-sectional views 800B-800E of some alternative embodiments of the semiconductor structure of FIG. 7 are provided in which the trench segments 104 are varied respectively as in FIGS. 1, 4B, 4C, and 4E.

Figure 8E:
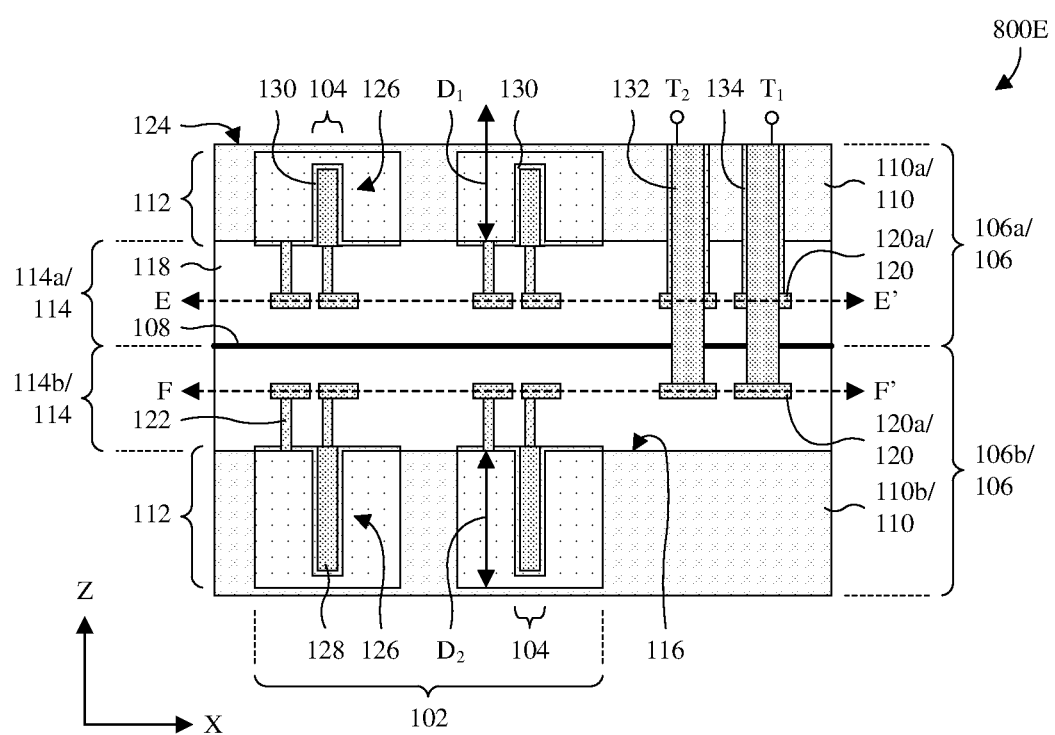

While FIGS. 7 and 8A-8D are not illustrated with the well regions 402 of FIG. 8E, it is to be appreciated that alternative embodiments of FIGS. 7 and 8A-8D may include the well regions 402. Further, while the top layout 200 of FIG. 2 is described with regard to the TSV wires 120a of FIG. 1, the top layout 200 is applicable to the TSV wires 120a of FIGS. 7 and 8A-8E. For example, alternative embodiments of FIG. 2 may be taken along line E-E' in any one of FIGS. 7 and 8A-8E and/or along line F-F' in any one of FIGS. 7 and 8A-8E. Alternative embodiments of FIG. 2 along line E-E' may, for example, be the same as the embodiments of FIG. 2, except that the TSVs 132 extend through the TSV wires 120a of the first IC die 106a and some of the vias 122 are omitted. Alternative embodiments of FIG. 2 along line F-F' may, for example, be the same as the embodiments of FIG. 2, except that some of the vias 122 may be omitted. Notwithstanding that the TSV wires 120a of FIGS. 7 and 8A-8E may have top layouts similar to the TSV wires 120a of FIG. 2, other top layouts are amenable.

Figure 9A:
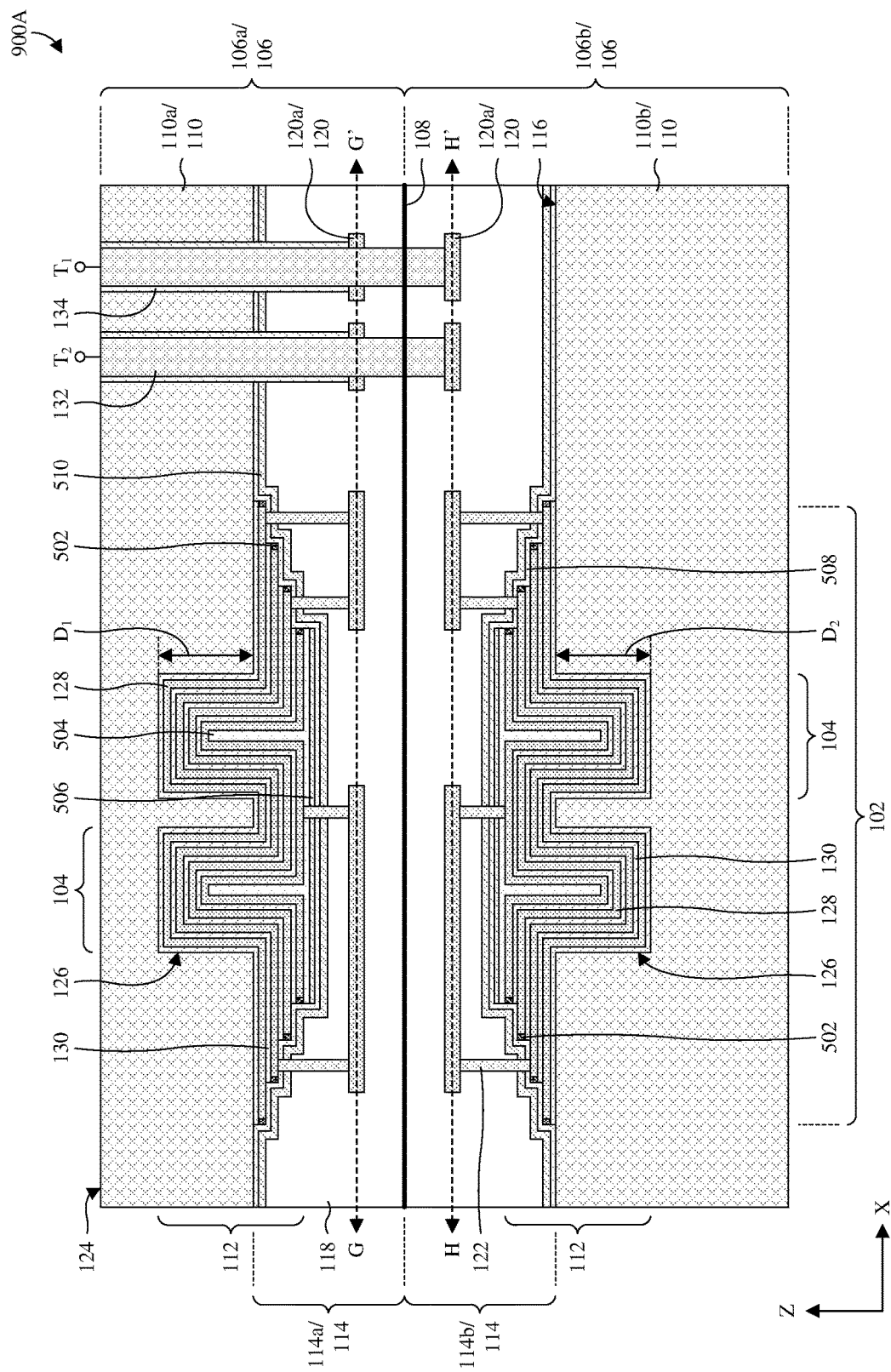
FIGS. 9A and 9B illustrate cross-sectional views of various alternative embodiments of the semiconductor structure of FIG. 7 in which the trench segments are defined by more capacitor electrodes than in FIG. 7.
Figure 9B:
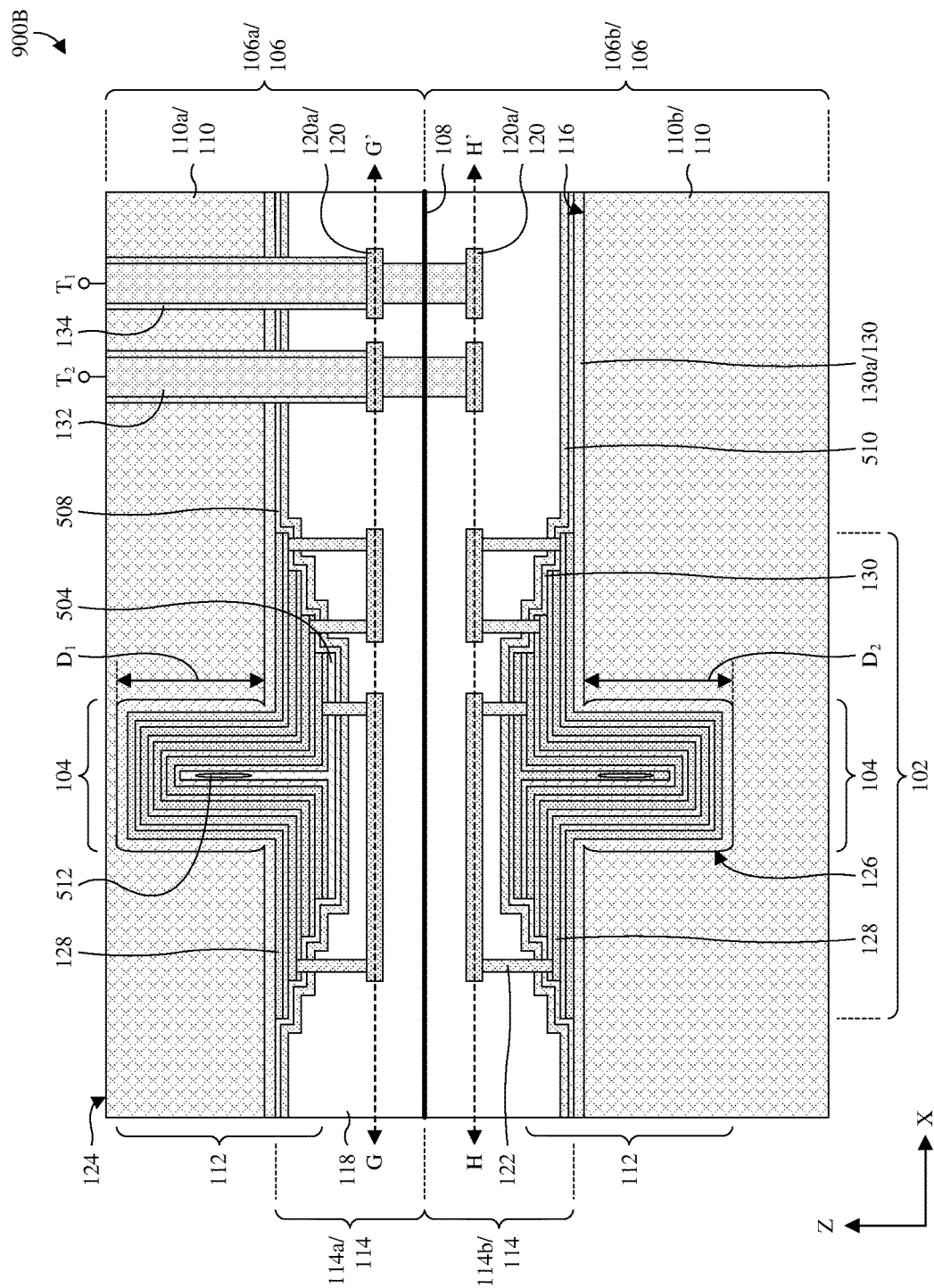

With reference to FIGS. 9A and 9B, cross-sectional views 900A, 900B of various alternative embodiments of the semiconductor structure of FIG. 7 are provided in which the trench segments 104 are defined by more capacitor electrodes and more capacitor dielectric layers than in FIG. 1. The semiconductor structures of FIGS. 9A and 9B may, for example, respectively be as the semiconductor structures of FIGS. 5A and 5B are described, except that the IC dies 106 are fusion bonded together at the front side bond interface 108 and the TSVs 132 electrically couple the 2D trench capacitors 126 in parallel.

While the top layout 600 of FIG. 6 is described with regard to the TSV wires 120a of FIG. 5A, the top layout 600 is applicable to the TSV wires 120a of FIGS. 9A and 9B. For example, alternative embodiments of FIG. 6 may be taken along line G-G' in any one of FIGS. 9A and 9B and/or along line H-H' in any one of FIGS. 9A and 9B. Alternative embodiments of FIG. 6 along line G-G' may, for example, be the same as the embodiments of FIG. 6, except that the TSVs 132 extend through the TSV wires 120a of the first IC die 106a and some of the vias 122 are omitted. Alternative embodiments of FIG. 6 along line H-H' may, for example, be the same as the embodiments of FIG. 6, except that some of the vias 122 are omitted. Notwithstanding that the TSV wires 120a of FIGS. 9A and 9B may have top layouts similar to the TSV wires 120a of FIG. 6, other top layouts are, however, amenable.

Figure 10A:
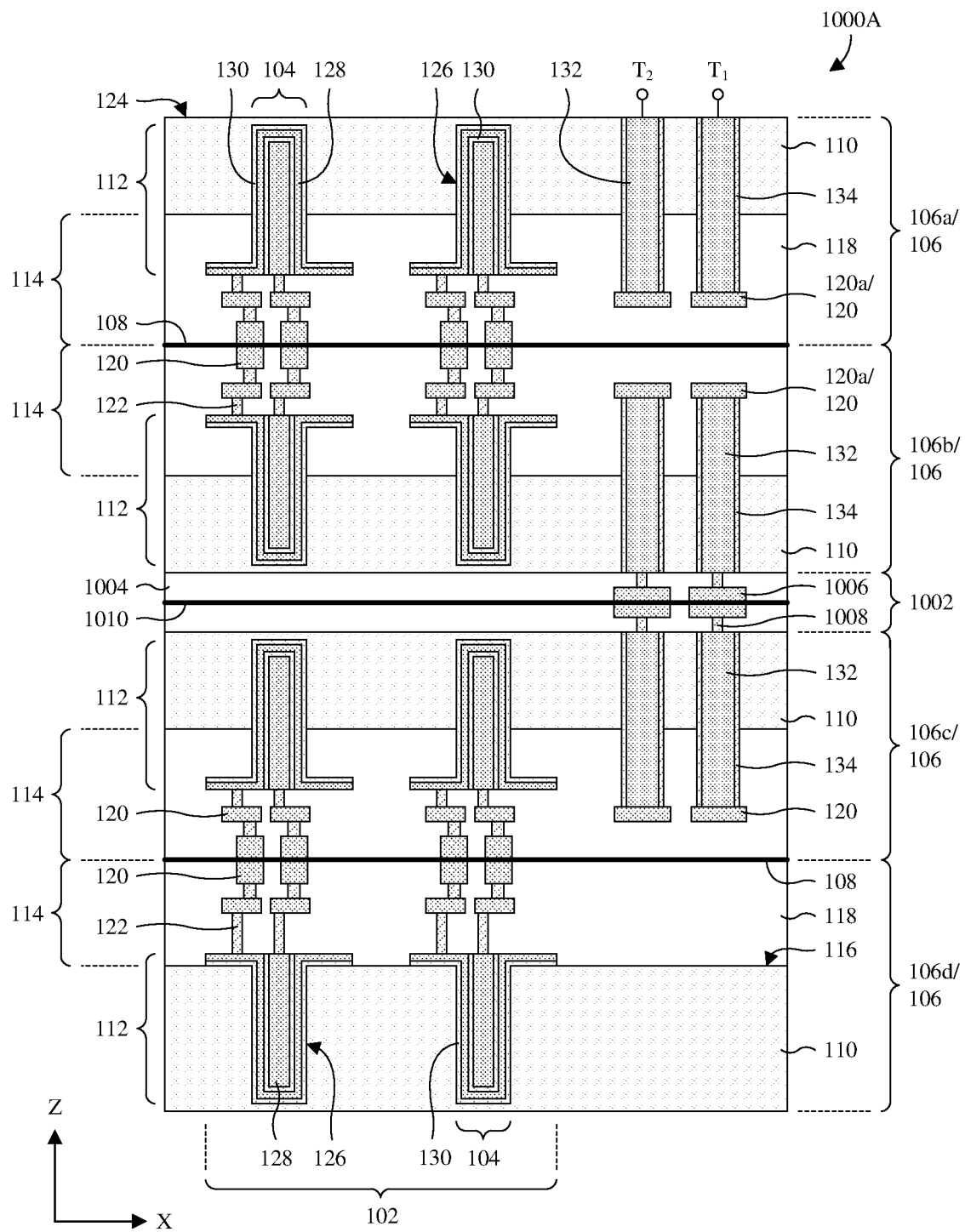
FIGS. 10A-10C illustrate cross-sectional views of various embodiments of a semiconductor structure in which a 3D trench capacitor has trench segments spanning at least four device layers and electrically coupled together by hybrid bonding and/or TSVs.

With reference to FIG. 10A, a cross-sectional view 1000A of some embodiments of a semiconductor structure is provided in which a 3D trench capacitor 102 is arranged within at least four IC dies 106. The semiconductor structure may, for example, be an IC, an IPD, or some other suitable semiconductor structure. The 3D trench capacitor 102 comprises a plurality of 2D trench capacitors 126 spread across the at least four IC dies 106 and electrically coupled in parallel, such that a capacitance of the 3D trench capacitor 102 is a sum of individual capacitances of the 2D trench capacitors 126. The at least four IC dies 106 comprise a first IC die 106a, a second IC die 106b, a third IC die 106c, and a fourth IC die 106d.

The first and second IC dies 106a, 106b are respectively as the first and second IC dies 106a, 106b of FIG. 1 are described, except TSVs 132 and TSV wires 120a are at both the first and second IC dies 106a, 106b. The TSV wires 120a of the first IC die 106a electrically couple the TSVs 132 of the first IC die 106a to the 2D trench capacitors 126 of the first IC die 106a through a remainder of the wires 120 and a remainder of the illustrated vias 122 in the first IC die 106a. The TSV wires 120a of the second IC die 106b electrically couple the TSVs 132 of the second IC die 106b to the 2D trench capacitors 126 of the second IC die 106b through a remainder of the wires 120 and a remainder of the vias 122 in the second IC die 106b. The TSV wires 120a of the first IC die 106a and/or the TSV wires 120a of the second IC die 106b may, for example, have the same top layout(s) as in FIG. 2 or some other suitable top layouts. The third and fourth IC dies 106c, 106d are respectively as the first and second IC dies 106a, 106b of FIG. 1 are described.

A bond structure 1002 is between the second and third IC dies 106b, 106c and bonds and electrically couples the second and third IC dies 106b, 106c together. The bond structure 1002 includes bond dielectric layers 1004, bond wires 1006, and bond vias 1008. The bond wires 1006 correspond to the second and third IC dies 106b, 106c and directly contact at a back side bond interface 1010. The bond dielectric layers 1004 correspond to the second and third IC dies 106b, 106c and directly contact at the back side bond interface 1010. The bond vias 1008 extend respectively from the bond wires 1006 to the TSVs 132 of the second and third IC dies 106b, 106c. Other bond structures are amenable in alternative embodiments.

Because the 2D trench capacitors 126 are spread across at least four device layers 112 in the vertical or Z dimension, a 2D projection of the 3D trench capacitor 102 onto a horizontal or XY plane may occupy a small area. Further, because the 2D trench capacitors 126 are electrically coupled in parallel, the capacitance of the 3D trench capacitor 102 is a sum of the capacitances of multiple 2D trench capacitors and may therefore be high. Because the 3D trench capacitor 102 may occupy a small area and may have a high capacitance, the 3D trench capacitor 102 may have a high capacitance density.

Figure 10B:
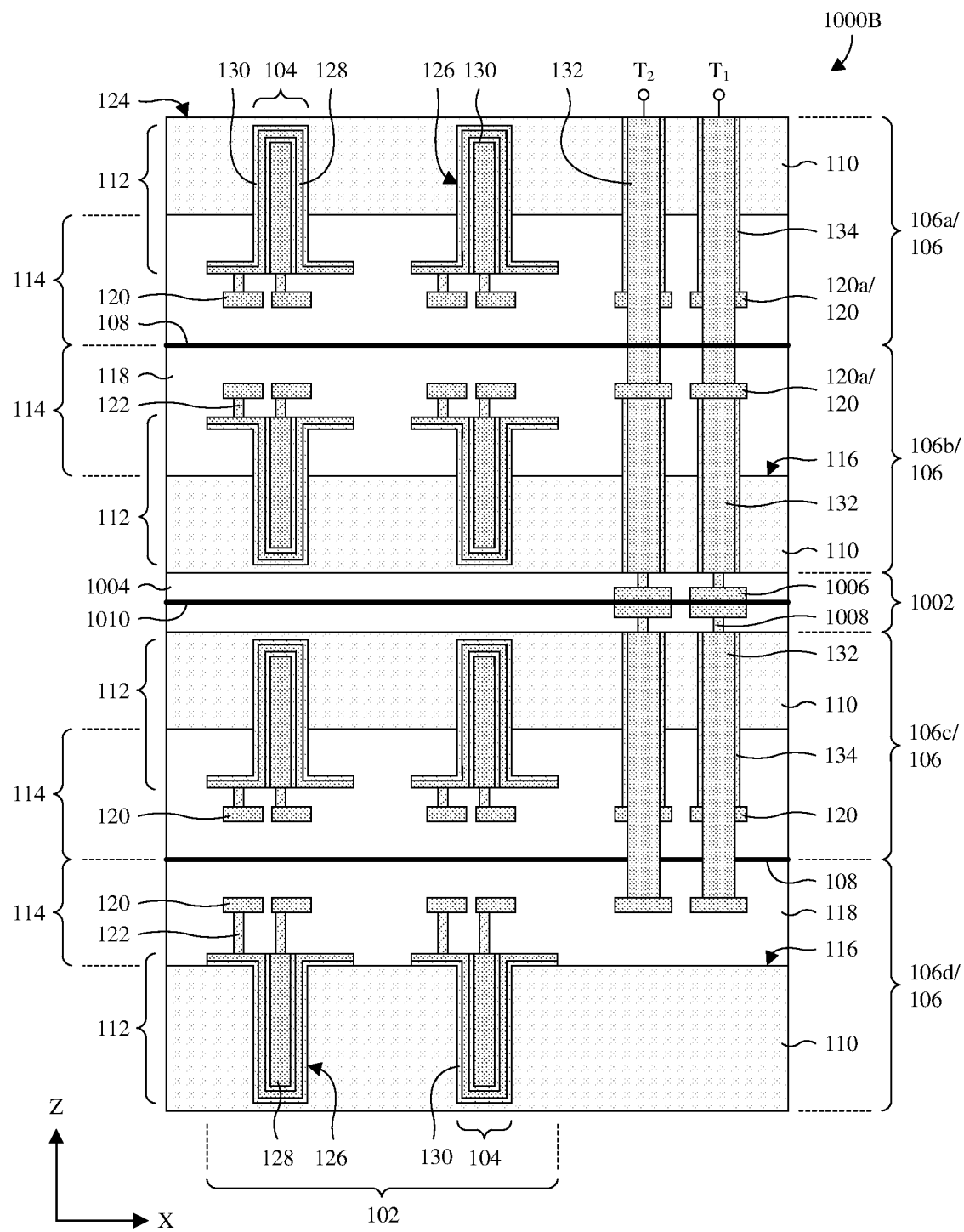

With reference to FIG. 10B, a cross-sectional view 1000B of some alternative embodiments of the semiconductor structure of FIG. 10A is provided in which the IC dies 106 are fusion bonded together and the TSVs 132 electrically couple the 2D trench capacitors 126 in parallel. The first and second dies 106a, 106b are respectively as the first and second IC dies 106a, 106b of FIG. 7 are described, except TSVs 132 are at the substrates 110 of both the first and second IC dies 106a, 106b. The third and fourth IC dies 106c, 106d are respectively as the first and second IC dies 106a, 106b of FIG. 7 are described.

Figure 10C:
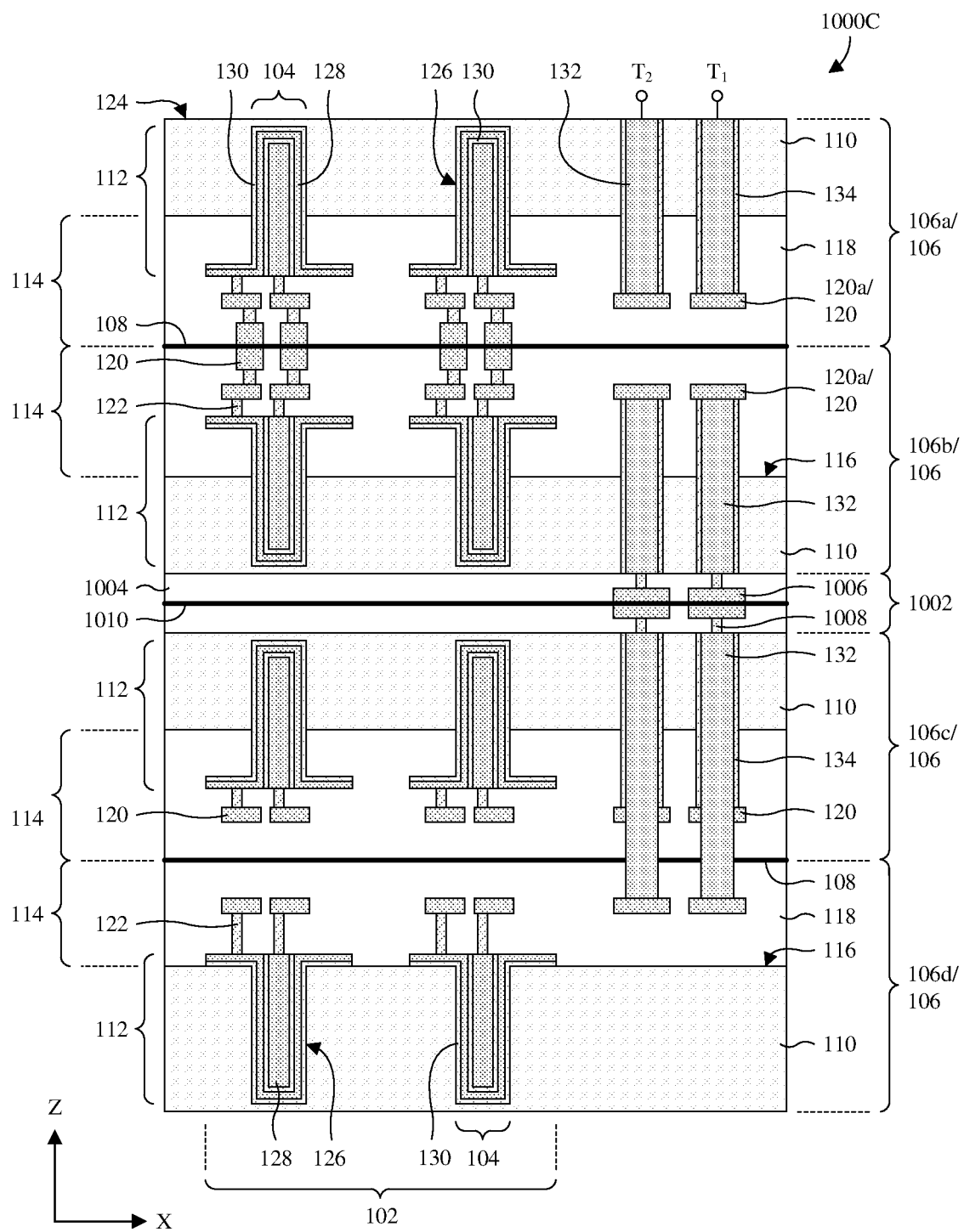

With reference to FIG. 10C, a cross-sectional view 1000C of some alternative embodiments of the semiconductor structure of FIG. 10A is provided in which the third and fourth IC dies 106c, 106d are fusion bonded together and the TSVs 132 of the third and fourth IC dies 106c, 106d electrically couple the 2D trench capacitors 126 of the third and fourth IC dies 106c, 106d in parallel. Further, the third and fourth IC dies 106c, 106d are respectively as the first and second IC dies 106a, 106b of FIG. 7 are described.

While FIGS. 10A-10C illustrate the 2D trench capacitors 126 of the first and second IC dies 106a, 106b as being configured as in FIGS. 1 and 7, the 2D trench capacitors 126 may alternatively be configured as in any one of FIGS. 4A-4E, 5A, 5B, 8A-8E, 9A, and 9B. Similarly, while FIGS. 10A-10C illustrate the 2D trench capacitors 126 of the third and fourth IC dies 106c, 106d as being configured as in FIGS. 1 and 7, the 2D trench capacitors 126 may alternatively be configured as in any one of FIGS. 4A-4E, 5A, 5B, 8A-8E, 9A, and 9B are amenable. While the 3D trench capacitor 102 is illustrated with four device layers 112, more or less device layers are amenable in alternative embodiments.

Figure 11:
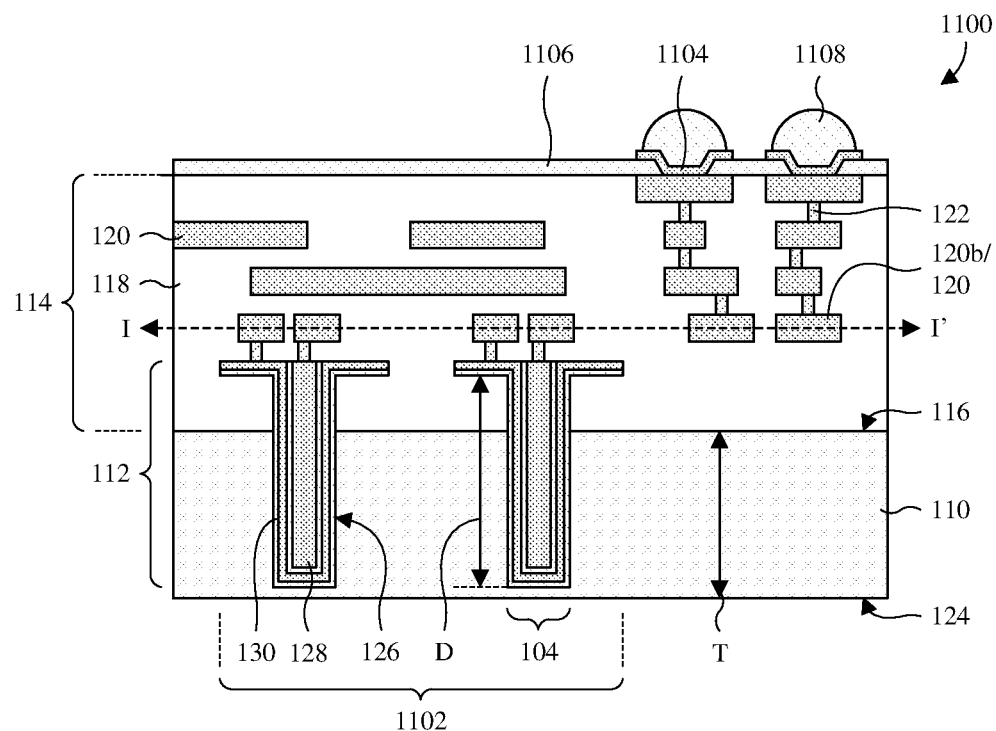
FIG. 11 illustrates a cross-sectional view of some embodiments of a semiconductor structure package in which a 2D trench capacitor has trench segments with a depth partially in an interconnect structure.

With reference to FIG. 11, a cross-sectional view 1100 of some embodiments of a semiconductor structure package is provided in which a composite capacitor 1102 comprises multiple 2D trench capacitors 126 localized to a single device layer 112 and electrically coupled in parallel. Further, a depth D of the 2D trench capacitors 126 is partially in an interconnect structure 114 and partially in a substrate 110. Because a portion of the depth D is in the interconnect structure 114, the depth D may be larger than if wholly or substantially in the substrate 110. As such, the 2D trench capacitors 126 may have larger capacitances than they would other otherwise have. The semiconductor structure package may, for example, be an IC package, an IPD package, or some other suitable semiconductor structure package.

In some embodiments, the depth D is about 4 micrometers or less, about 6 micrometers or less, about 8 micrometers or less, about 4-8 micrometers, or some other suitable value. If the depth D is too low (e.g., less than about 4 micrometers or some other suitable value), the capacitances of the 2D trench capacitors 126 may be low. If the depth D is too high (e.g., greater than about 6 micrometers, 8 micrometers, or some other suitable value), aspect ratios of trenches within which the trench segments 104 are formed may be high. In some embodiments, the portion of the depth D in the interconnect structure 114 is about 20-60 percent, about 20-40 percent, about 40-60 percent, or some other suitable percentage of the depth D. If the portion of the depth D in the interconnect structure 114 makes up too small a percentage of the depth D (e.g., less than about 20 percent or some other suitable value), the increased manufacturing costs may not outweigh the benefit from increased capacitance. In some embodiments, the portion of the depth D in the interconnect structure 114 is about 10-50 percent, about 10-20 percent, about 20-30 percent, about 30-40 percent, about 40-50 percent, or some other suitable percentage of a thickness T of the substrate 110.

The 2D trench capacitors 126 and the substrate 110 are as described with regard to FIG. 1. Further, the interconnect structure 114 is as described with regard to FIG. 1, except for the layout of the wires 120 and the vias 122. The wires 120 and the vias 122 are alternatingly stacked in the interconnect dielectric layer 118 to define conductive paths extending from the 2D trench capacitors 126 to under bump metallization (UBM) layers 1104 along a top of the semiconductor structure package. Note that the conductive paths are not fully visible. Further, the wires 120 and the vias 122 define conductive paths electrically coupling the 2D trench capacitors 126 in parallel. In alternative embodiments, the 2D trench capacitors 126 are electrically separated from each other. Further, in some embodiments, wires 120b bordering the 2D trench capacitors 126 respectively have the same top layouts as the TSV wires 120a of FIG. 2. For example, FIG. 2 may be taken along line I-I'. Other suitable top layouts are amenable.

The UBM layers 1104 extend through a passivation layer 1106 overlying the interconnect structure 114, and bumps 1108 overlie the UBM layers 1104. The UBM layers 1104 and the bumps 1108 may be or comprise, for example, metal and/or some other suitable conductive material(s). The passivation layer 1106 may be or comprise, for example, silicon oxide and/or some other suitable dielectric(s).

With reference to FIGS. 12-20, a series of cross-sectional views 1200-2000 of some embodiments of a method for forming the semiconductor structure of FIG. 1 is provided. The semiconductor structure has trench segments that are on at least two substrates and that are electrically coupled together by hybrid bonding. Notwithstanding that the method forms the semiconductor structure of FIG. 1, the method and variations of the method may be employed to form the semiconductor structure in any one of FIGS. 4A-4E, 5A, 5B, 10A, and 10C or to form some other suitable semiconductor structure.

Figure 12:
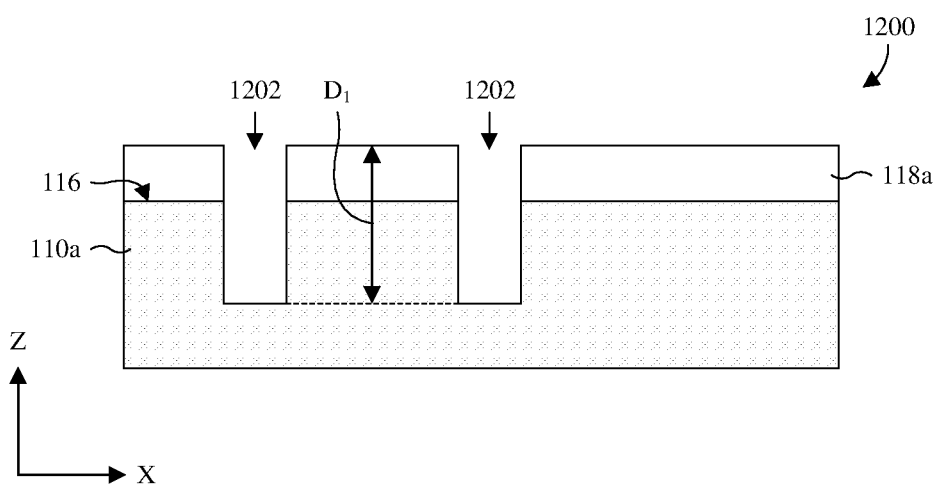
FIGS. 12-20 illustrate a series of cross-sectional views of some embodiments of a method for forming a semiconductor structure in which a 3D trench capacitor has trench segments electrically coupled together by hybrid bonding.

As illustrated by the cross-sectional view 1200 of FIG. 12, a first interconnect dielectric layer 118a is deposited on a front side 116 of a first substrate 110a. The first interconnect dielectric layers 118a may be or comprise, for example, silicon oxide, some other suitable oxide, some other suitable dielectric, or any combination of the foregoing. In alternative embodiments, the first interconnect dielectric layer 118a is omitted. In alternative embodiments, well regions are formed in the first substrate 110a before depositing the first interconnect dielectric layer 118a and subsequently formed 2D trench capacitors are formed in the well regions. See, for example, the well regions 402 of FIG. 4E.

Also illustrated by the cross-sectional view 1200 of FIG. 12, the first interconnect dielectric layer 118a and the first substrate 110a are patterned to form a pair of trenches 1202. In alternative embodiments, more or less trenches are formed. The trenches 1202 have a first depth $D_1$ partially in the first interconnect dielectric layer 118a and partially in the first substrate 110a. Because a portion of the first depth $D_1$ is in first interconnect dielectric layer 118a, the first depth $D_1$ may be larger than it would be if wholly or substantially in the first substrate 110a. As such, 2D trench capacitors subsequently formed in the trenches 1202 may have larger capacitances than they would otherwise have. The patterning may, for example, be performed by or comprise a photolithography/etching process and/or some other suitable process(es).

Figure 13:
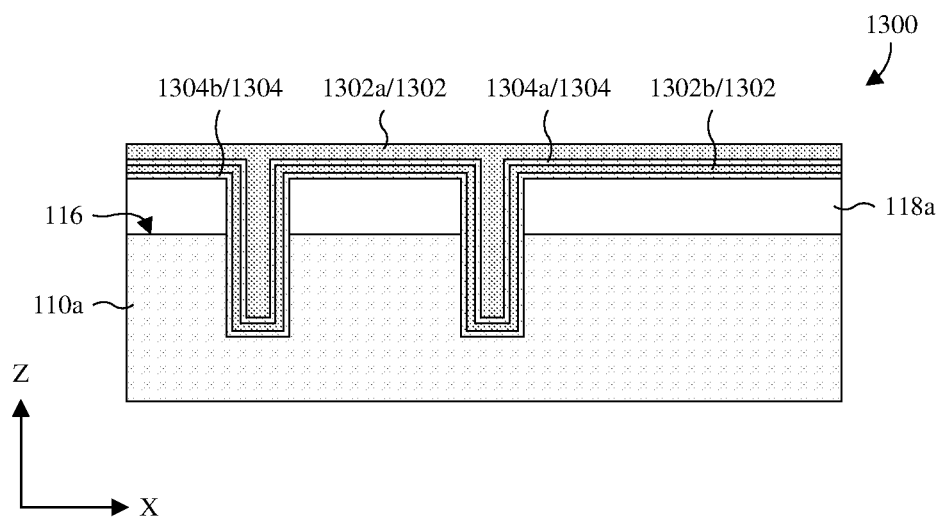

As illustrated by the cross-sectional view 1300 of FIG. 13, a plurality of conductive layers 1302 and a plurality of dielectric layers 1304 are alternatingly deposited over the first interconnect dielectric layer 118a and lining the trenches 1202 (see, e.g., FIG. 12). In alternative embodiments, one or more conductive layers and/or one or more dielectric layers is/are deposited. The conductive layers 1302 may, for example, be or comprise metal and/or some other suitable conductive material(s). The dielectric layers 1304 may, for example, be or comprise silicon oxide, a high k dielectric, some other suitable dielectric(s), or any combination of the foregoing.

Figure 14:
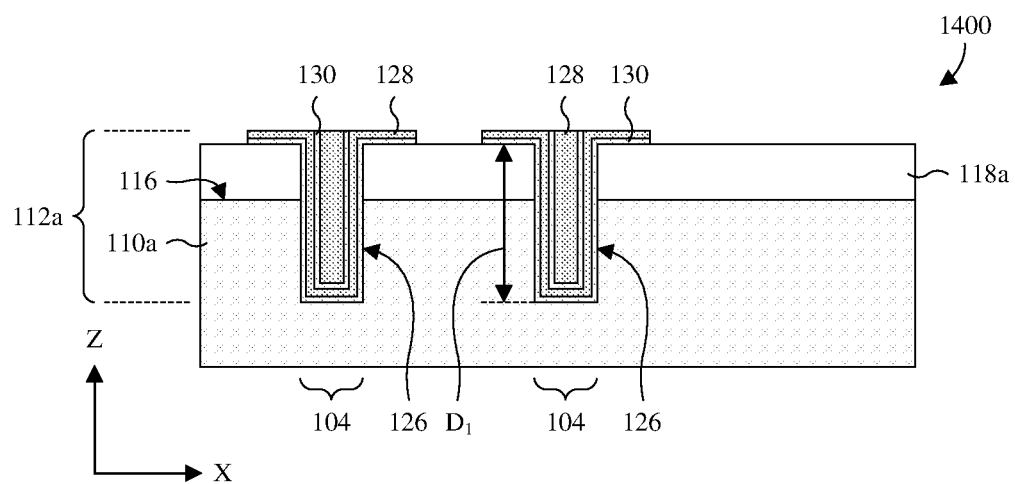

As illustrated by the cross-sectional view 1400 of FIG. 14, the conductive layers 1302 (see, e.g., FIG. 13) and the dielectric layers 1304 (see, e.g., FIG. 13) are patterned to form a plurality of 2D trench capacitors 126 defining a first device layer 112a. In alternative embodiments, more or less 2D trench capacitors 126 are formed. For example, a single 2D trench capacitor 126 may be formed in alternative embodiments. The 2D trench capacitors 126 comprise corresponding capacitor electrodes 128 and corresponding capacitor dielectric layers 130 that are alternatingly stacked and respectively formed from the conductive layers 1302 and the dielectric layers 1304. Further, the 2D trench capacitors 126 have corresponding trench segments 104. The trench segments 104 are defined by the capacitor electrodes 128 and the capacitor dielectric layers 130 and are respectively at the first trenches 1202 (see, e.g., FIG. 12).

Because the trenches 1202 are formed with the first depth $D_1$, the trench segments 104 are formed with the first depth $D_1$. As such, the trench segments 104 laterally contact both the first interconnect dielectric layer 118a and the first substrate 110a. Further, because a portion of the first depth $D_1$ is in first interconnect dielectric layer 118a, the first depth $D_1$ may be larger than it would be if wholly or substantially in the first substrate 110a. As such, the 2D trench capacitors 126 may have larger capacitances than they would otherwise have.

The patterning of the conductive layers 1302 and the dielectric layers 1304 may, for example, comprise: 1) performing a planarization into a top conductive layer 1302a (see, e.g., FIG. 13) and a top dielectric layer 1304a (see, e.g., FIG. 13) to uncover a lower conductive layer 1302b (see, e.g., FIG. 13); and 2) performing a photolithography/etching process on the lower conductive layer 1302b and a lower dielectric layer 1304b (see, e.g., FIG. 13). Other processes for performing the patterning are, however, amenable.

Figure 15:
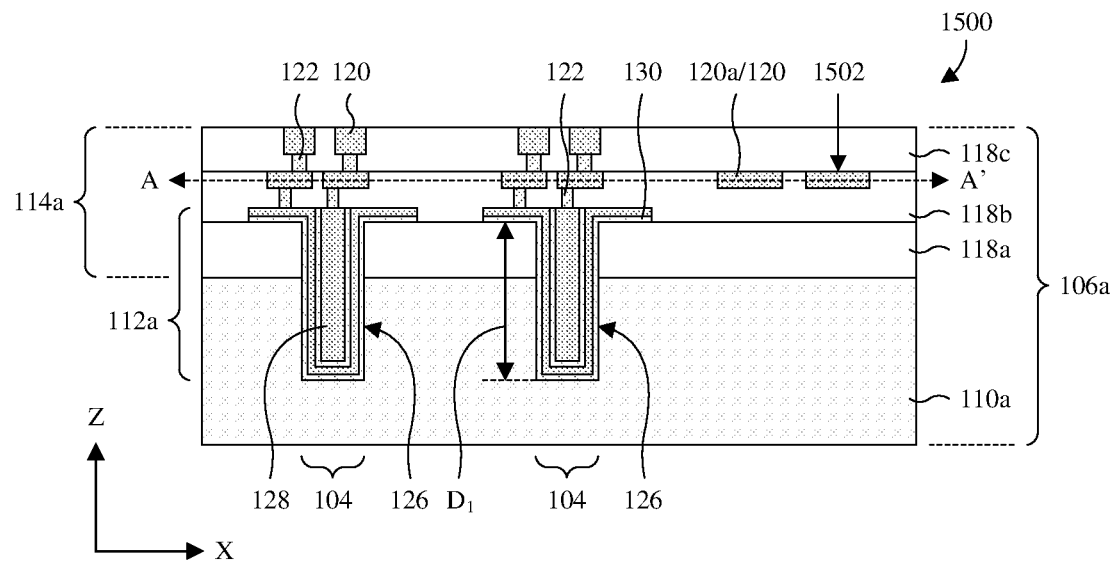

As illustrated by the cross-sectional view 1500 of FIG. 15, a second interconnect dielectric layer 118b and a third interconnect dielectric layer 118c are formed over the 2D trench capacitors 126. The second and third interconnect dielectric layers 118b, 118c may be or comprise, for example, silicon oxide, silicon nitride, a low k dielectric, some other suitable dielectric(s), or any combination of the foregoing. In some embodiments, the third interconnect dielectric layer 118c is or comprise silicon oxide, some other suitable oxide, silicon oxynitride, some other suitable dielectric, or any combination of the foregoing.

Also illustrated by the cross-sectional view 1500 of FIG. 15, a plurality of wires 120 and a plurality of vias 122 are formed in the second and third interconnect dielectric layers 118b, 118c while forming the second and third interconnect dielectric layers 118b, 118c. The wires 120 and the vias 122 are alternatingly stacked in the second and third interconnect dielectric layers 118b, 118c to define conductive paths electrically coupling the 2D trench capacitors 126 in parallel. Further, TSV wires 120a define pads 1502 to receive subsequently formed TSVs and electrically couple the pads 1502 to a remainder of the wires 120 and a remainder of the illustrated vias 122. The remainder of the wires 120 and the remainder of the illustrated vias 122, in turn, electrically couple the TSV wires 120a to terminals of the 2D trench capacitors 126. In some embodiments, the TSV wires 120a have the same top layout as in FIG. 2. For example, FIG. 2 may be taken along line A-A'. In alternative embodiments, the TSV wires 120a have some other suitable top layout.

The first, second, and third interconnect dielectric layers 118a-118c, the wires 120, and the vias 122 collectively define a first interconnect structure 114a. For ease of illustration, the first, second, and third interconnect dielectric layers 118a-118c are hereafter shown (e.g., in FIG. 16 onward) as a single layer and are hereafter referred to collectively as an interconnect dielectric layer 118. The first interconnect structure 114a, the first device layer 112a, and the first substrate 110a collectively define a first IC die 106a. While the first IC die 106a is formed as illustrated as in FIG. 1, the first IC die 106a may alternatively be formed as illustrated in any one of FIGS. 4A-4E, 5A, and 5B.

Figure 16:
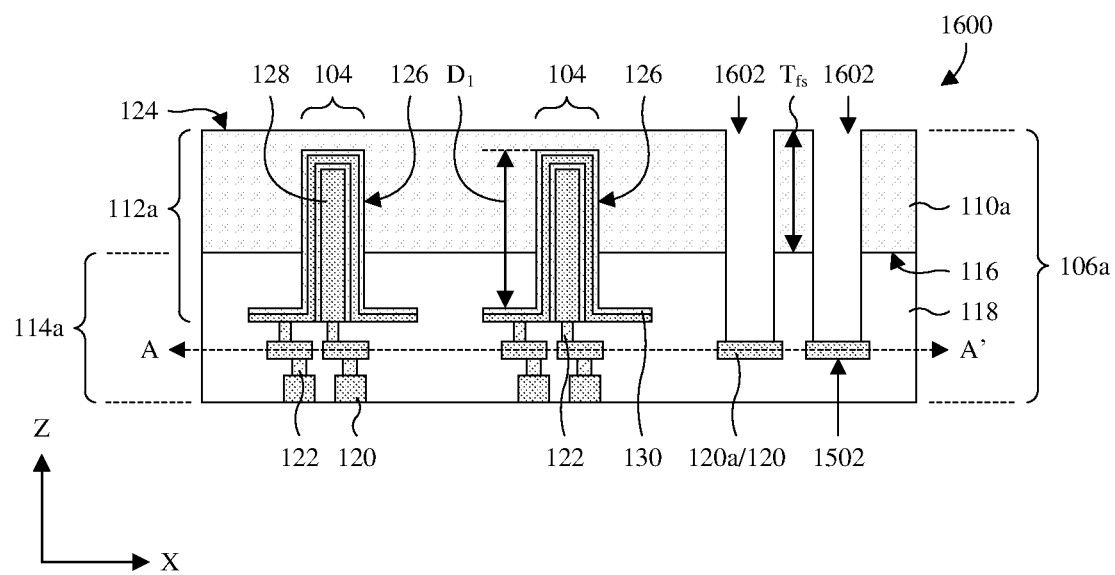

As illustrated by the cross-sectional view 1600 of FIG. 16, the first IC die 106a is flipped vertically and the first substrate 110a is thinned from a back side 124 of the first substrate 110a. Further, the first IC die 106a is patterned from the back side 124 of the first substrate 110a to form via openings 1602 respectively exposing the pads 1502. The thinning reduces a thickness $T_{fs}$ of the first substrate 110a and may, for example, be performed by a CMP or some other suitable planarization. The patterning may, for example, be performed by a photolithography/etching process or some other suitable patterning process.

Because the via openings 1602 extend through the first substrate 110a, an aspect ratio (e.g., a ratio of height to width) of the via openings 1602 may be high. However, if the aspect ratio is too high, it may be difficult to reliably form the via openings 1602 and/or it may be difficult to subsequently form TSVs in the via openings 1602. For example, material may cluster around top corners of the via openings 1602 during deposition of layers from which the TSVs are formed. This phenomenon may be known as trench necking. The clustering may pinch off tops of the via openings 1602 before the deposition completes and may hence lead to voids forming in the via openings 1602. The voids may lead to the TSVs having high resistances that increase power consumption and/or shift operating parameters out of specification.

To mitigate the aforementioned concerns, the thinning is performed. By reducing the thickness $T_{fs}$, the thinning reduces the aspect ratio of the via openings 1602. However, by reducing the thickness $T_{fs}$, the thinning also limits how far into the first substrate 110a the trench segments 104 may extend. In other words, the thinning limits the portion of the first depth $D_1$ in the first substrate 110a. If the trench segments 104 were wholly or substantially in the first substrate 110a, the thinning would limit the first depth $D_1$ and would hence limit the capacitance of the 2D trench capacitors 126. However, because a portion of the first depth $D_1$ is also in the interconnect dielectric layer 118, the negative effects from the thinning are mitigated and the 2D trench capacitors 126 may have high capacitances.

Figure 17:
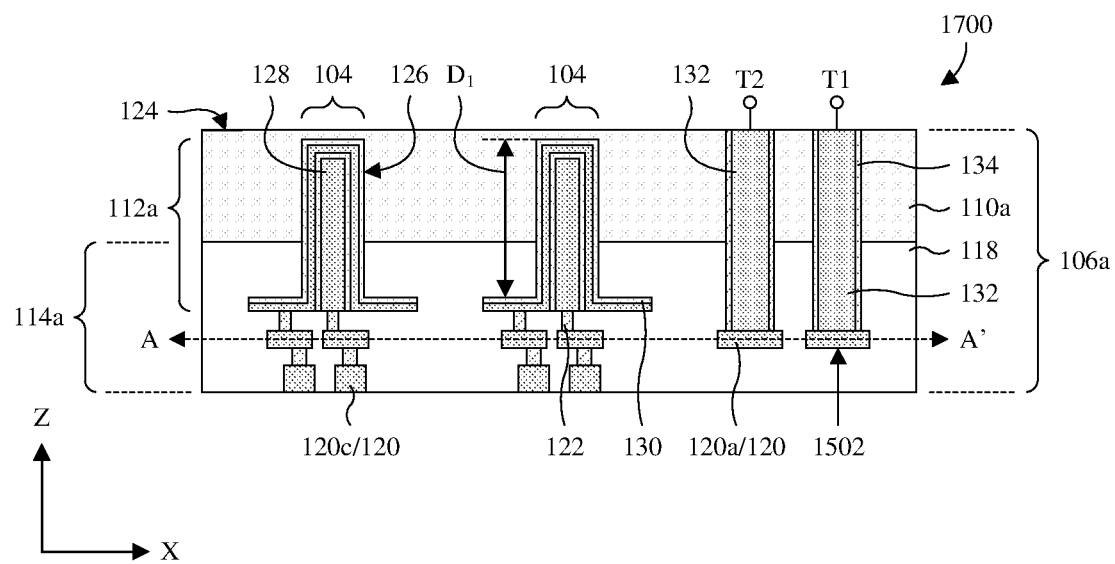

As illustrated by the cross-sectional view 1700 of FIG. 17, TSVs 132 and TSV dielectric layers 134 are formed in the via openings 1602 (see, e.g., FIG. 16). The TSVs 132 correspond to a first terminal $T_1$ of the 3D trench capacitor being formed and a second terminal $T_2$ of the 3D trench capacitor. Further, the TSVs 132 are electrically coupled respectively to terminals of the 2D trench capacitors 126 by the wires 120 and the vias 122. The TSV dielectric layers 134 separate the TSVs 132 from the first substrate 110a.

A process for forming the TSV dielectric layers 134 may, for example, comprise: 1) depositing a dielectric layer over the first substrate 110a and further lining and partially filling the via openings 1602; and 2) etching back the dielectric layer to expose the back side 124 of the first substrate 110a and the pads 1502. A process for forming the TSVs 132 may, for example, comprise: 1) depositing a conductive layer over the first substrate 110a and the TSV dielectric layers 134 and further filling a remainder of the via openings 1602; and 2) performing a planarization into the conductive layer from the back side 124 of the first substrate 110a to expose the back side 124 of the first substrate 110a. The planarization may, for example, be or comprise a CMP or some other suitable planarization. Other processes for forming the TSV dielectric layers 134 and/or the TSVs 132 is/are, however, amenable.

Figure 18:
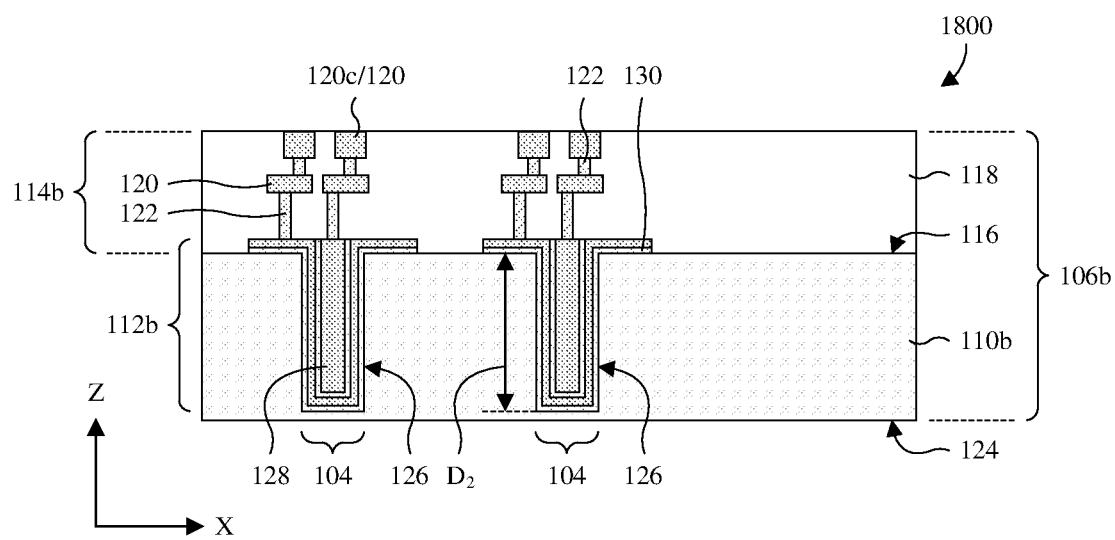

As illustrated by the cross-sectional view 1800 of FIG. 18, a second device layer 112b is formed over a second substrate 110b. The second device layer 112b comprises a plurality of 2D trench capacitors 126. In alternative embodiments, more or less 2D trench capacitors 126 are formed. For example, a single 2D trench capacitor 126 may be formed in alternative embodiments. The 2D trench capacitors 126 comprise corresponding capacitor electrodes 128 and corresponding capacitor dielectric layers 130 that are alternatingly stacked and that define trench segments 104. The trench segments 104 extend or protrude into the second substrate 110b and have a second depth $D_2$ wholly or substantially in the second substrate 110b. This is in contrast with the trench segments 104 of the first IC die 106a (see, e.g., FIG. 17), which have a first depth $D_1$ partially in the first substrate 110a.

Also illustrated by the cross-sectional view 1800 of FIG. 18, a second interconnect structure 114b is formed over and electrically coupled to the second device layer 112b. The second interconnect structure 114b comprises an interconnect dielectric layer 118 and further comprises a plurality of wires 120 and a plurality of vias 122. The wires 120 and the vias 122 are alternatingly stacked in the interconnect dielectric layer 118 to define conductive paths electrically coupling the 2D trench capacitors 126 in parallel. Further, bond wires 120c at a top of the second interconnect structure 114b have the same top layout as their counterparts in the first IC die 106a (also labeled 120c in FIG. 17).

The second interconnect structure 114b, the second device layer 112b, and the second substrate 110b collectively define a second IC die 106b. In some embodiments, the second IC die 106b is formed by the same process described at FIGS. 12-15, except that the wires 120 and the vias 122 have a different layout. Further, the first interconnect dielectric layer 118a at FIG. 14 is not formed so the trench segments 104 are wholly or substantially in the second substrate 110b.

In alternative embodiments, the second IC die 106b is formed by the same process described at FIGS. 12-15 or by some other suitable process. Further, while the second IC die 106b is formed as illustrated as in FIG. 1, the second IC die 106b may alternatively be formed as illustrated in any one of FIGS. 4A-4E, 5A, and 5B.

Figure 19:
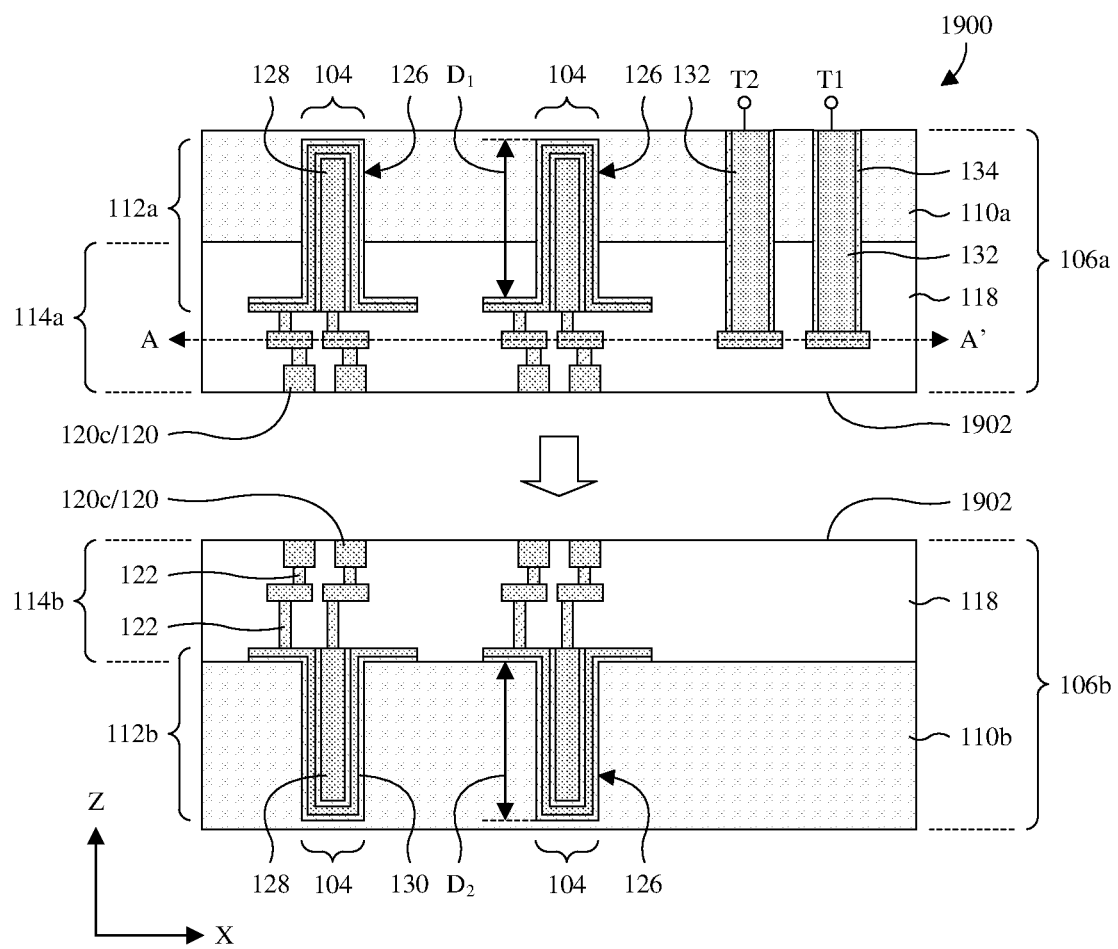

As illustrated by the cross-sectional view 1900 of FIG. 19, bond surfaces 1902 of the first and second interconnect structures 114a, 114b are pre-treated and then coarsely aligned. In alternative embodiments, the course alignment and/or the pre-treatment is/are omitted. The pre-treatment may, for example, comprise a cleaning process, plasma treatment, some other suitable pre-treatment process(es) for hybrid bonding, or any combination of the foregoing. In some embodiments, the plasma treatment cleans the bond surfaces 1902.

Also illustrated by cross-sectional view 1900 of FIG. 19, the bond surfaces 1902 are hybrid bonded together. A process for performing the hybrid bonding may, for example, comprise: 1) finely aligning the first IC die 106a to the second IC die 106b so the bond wires 120c of the first IC die 106a respectively overlie and are aligned to the bond wires 120c of the second IC die 106b; and 2) bringing the bond surfaces 1902 into direct contact. Other processes for performing the hybrid bonding are, however, amenable.

Figure 20:
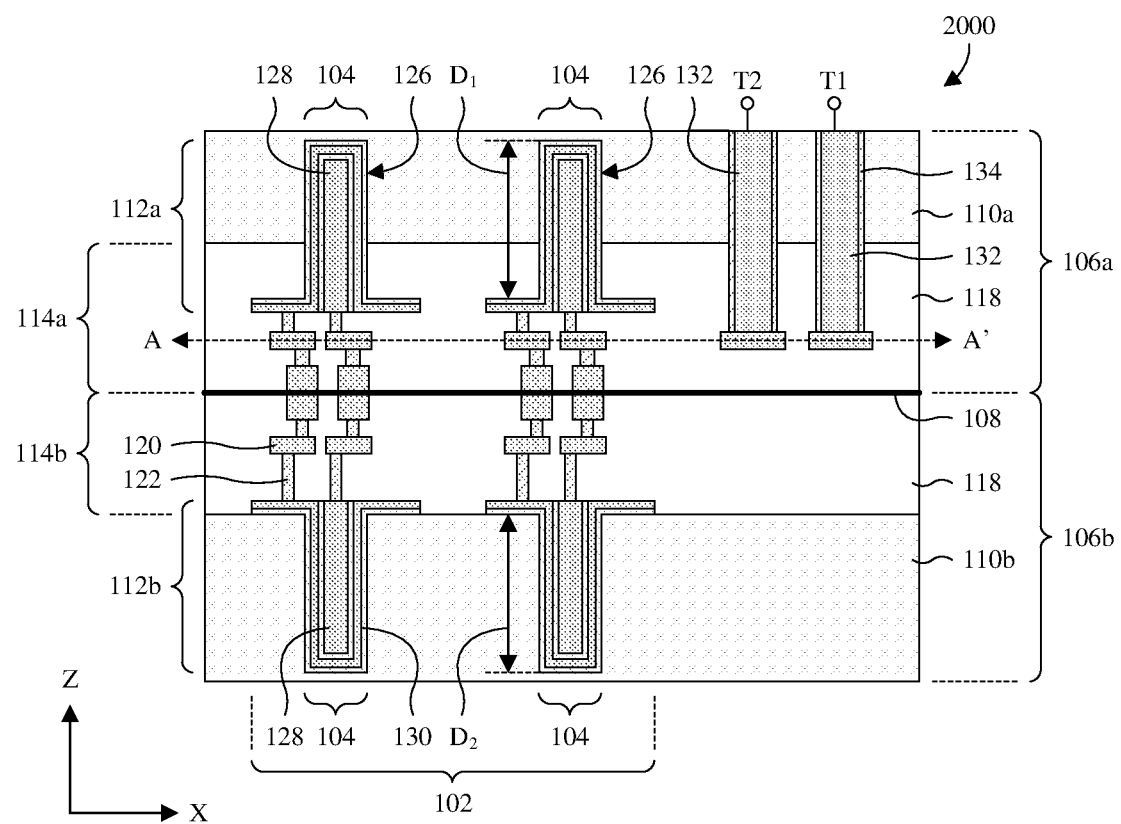

As illustrated by the cross-sectional view 2000 of FIG. 20, the first and second IC dies 106a, 106b are annealed to strength a front side bond interface 108 at which the first and second IC dies 106a, 106b directly contact. The 2D trench capacitors 126 of the first IC die 106a are electrically coupled in parallel with the 2D trench capacitors 126 of the second IC die 106b through the front side bond interface 108 by the wires 120 and the vias 122 in the first and second IC dies 106a, 106b. Further, the wires 120 of the first IC die 106a and the vias 122 of the first IC die 106a electrically couple the 2D trench capacitors 126 of the first and second IC dies 106a, 106b to the TSVs 132. Collectively, the 2D trench capacitors 126 of the first and second IC dies 106a, 106b define a 3D trench capacitor 102.

Because the 2D trench capacitors 126 are spread across the multiple device layers (e.g., the first and second device layers 112a, 112b) in the vertical or Z dimension, the 3D trench capacitor 102 may have a small footprint. Further, because the capacitances of the 3D trench capacitor 102 is a sum of the capacitances of multiple 2D trench capacitors (e.g., the sum the capacitances of the 2D trench capacitors 126 in the first and second IC dies 106a, 106b), the 3D trench capacitor 102 may have a high capacitance. As a result of the high capacitance and the small footprint, the 3D trench capacitor 102 may have a high capacitance density. That is to say, a capacitance per unit area in the footprint of the 3D trench capacitor 102 may be high.

While FIGS. 12-20 are described with reference to various embodiments of a method, it will be appreciated that the structures shown in FIGS. 12-20 are not limited to the method but rather may stand alone separate of the method. While FIGS. 12-20 are described as a series of acts, it will be appreciated that the order of the acts may be altered in other embodiments. While FIGS. 12-20 illustrate and describe as a specific set of acts, some acts that are illustrated and/or described may be omitted in other embodiments. Further, acts that are not illustrated and/or described may be included in other embodiments.

Figure 21:
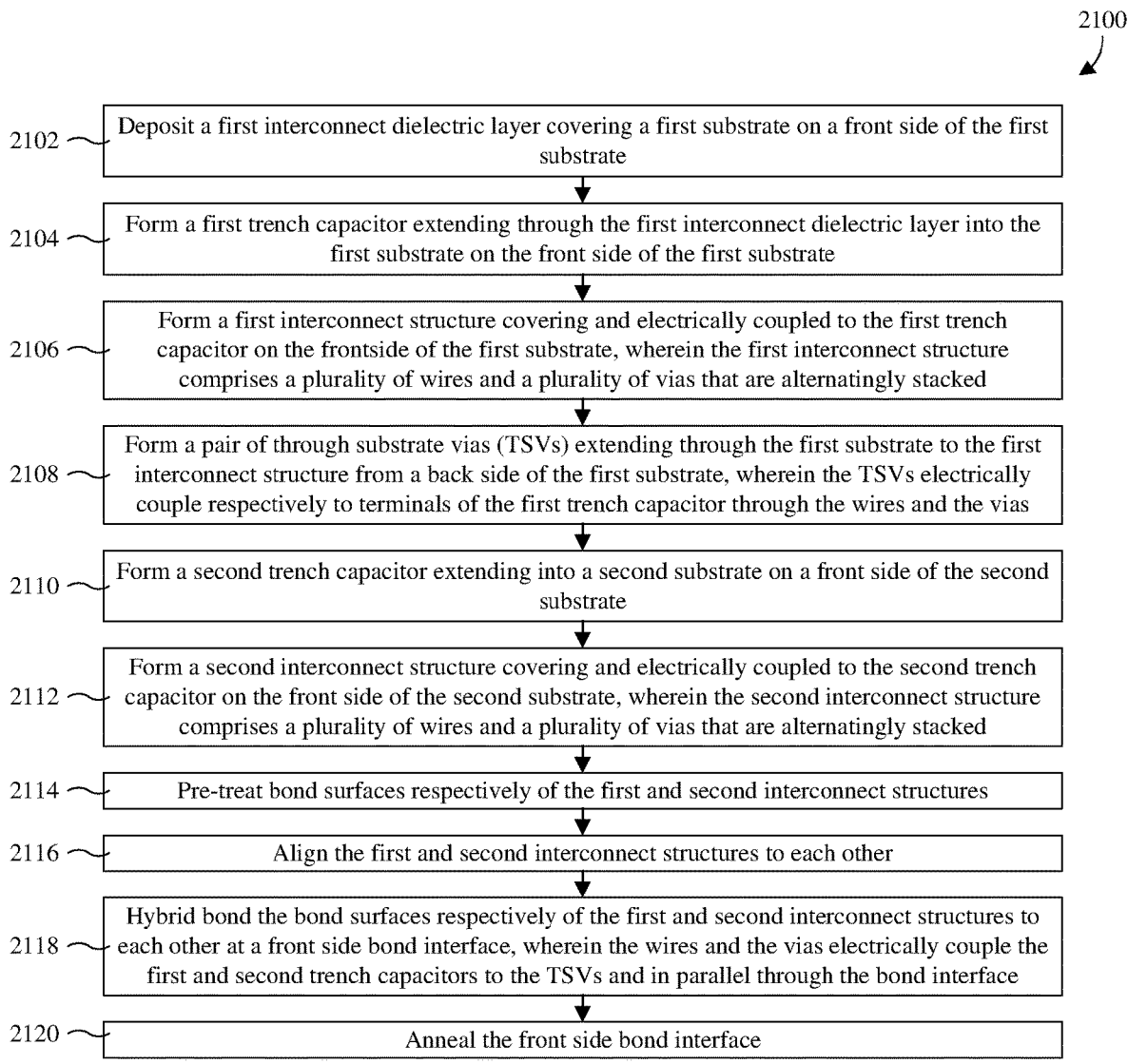
FIG. 21 illustrates a block diagram of some embodiments of the method of FIGS. 12-20.

With reference to FIG. 21, a block diagram 2100 of some embodiments of the method of FIGS. 12-20 is provided.

At 2102, a first interconnect dielectric layer is deposited covering a first substrate on a front side of the first substrate. See, for example, FIG. 12. In alternative embodiments, the depositing of the first interconnect dielectric layer is omitted.

At 2104, a first trench capacitor is formed extending through the first interconnect dielectric layer into the first substrate on the front side of the first substrate. See, for example, FIGS. 12-14.

At 2106, a first interconnect structure is formed covering and electrically coupled to the first trench capacitor on the front side of the first substrate, wherein the first interconnect structure comprises a plurality of wires and a plurality of vias that are alternatingly stacked. See, for example, FIG. 15.

At 2108, a pair of TSVs is formed extending through the first substrate to the first interconnect structure from a back side of the first substrate, wherein the TSVs electrically couple respectively to terminals of the first trench capacitor through the wires and the vias. See, for example, FIGS. 16 and 17.

At 2110, a second trench capacitor is formed extending into a second substrate on a front side of the second substrate. See, for example, FIG. 18.

At 2112, a second interconnect structure is formed covering and electrically coupled to the second trench capacitor on the front side of the second substrate, wherein the second interconnect structure comprises a plurality of wires and a plurality of vias that are alternatingly stacked. See, for example, FIG. 18.

At 2114, bond surfaces respectively of the first and second interconnect structures are pre-treated. See, for example, FIG. 19.

At 2116, the first and second interconnect structures are aligned to each other. See, for example, FIG. 19.

At 2118, the bond surfaces respectively of the first and second interconnect structures are hybrid bonded to each other at a front side bond interface, wherein the wires and the vias electrically couple the first and second trench capacitors to the TSVs and in parallel through the front side bond interface. See, for example, FIG. 19. Collectively, the first and second trench capacitors define a 3D trench capacitor. Because the first and second trench capacitors are spread across multiple substrates in the vertical or Z dimension, the 3D trench capacitor may have both a small footprint and a high capacitance. As a result of the high capacitance and the small footprint, the 3D trench capacitor may have a high capacitance density.

At 2120, the front side bond interface is annealed to strength the front side bond interface. See, for example, FIG. 20.

While the block diagram 2100 of FIG. 21 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 22-27, a series of cross-sectional views 2200-2700 of some embodiments of a method for forming the semiconductor structure of FIG. 7 is provided. The semiconductor structure has trench segments that are on at least two substrates and that are electrically coupled together by TSVs. Notwithstanding that the method forms the semiconductor structure of FIG. 7, the method and variations of the method may be employed to form the semiconductor structure in any one of FIGS. 8A-8E, 9A, 9B, 10B, and 10C or to form some other suitable semiconductor structure.

Figure 22:
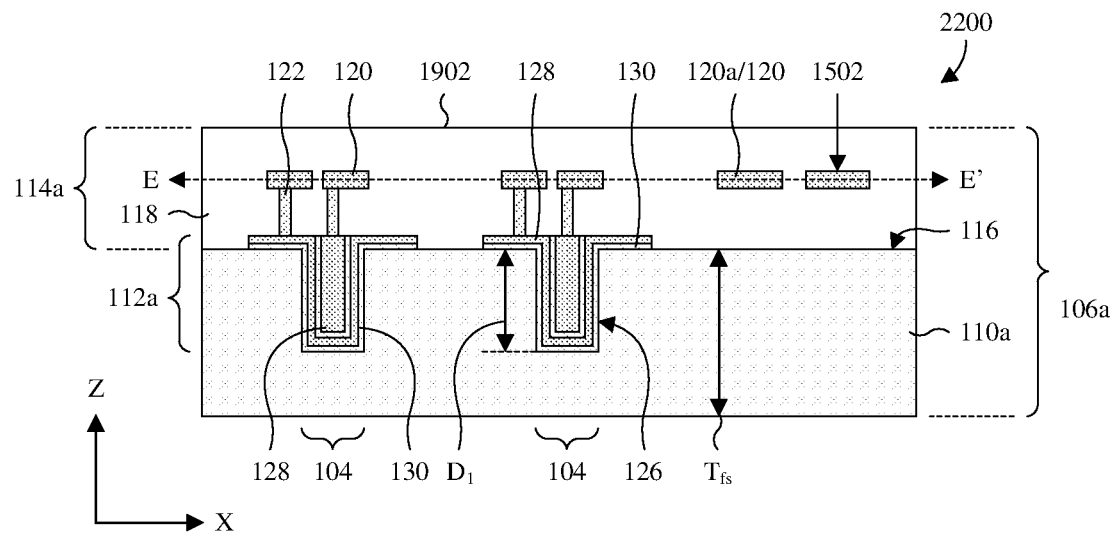
FIGS. 22-27 illustrate a series of cross-sectional views of some embodiments of a method for forming a semiconductor structure in which a 3D trench capacitor has trench segments electrically coupled together by TSVs instead of hybrid bonding.
Figure 23:
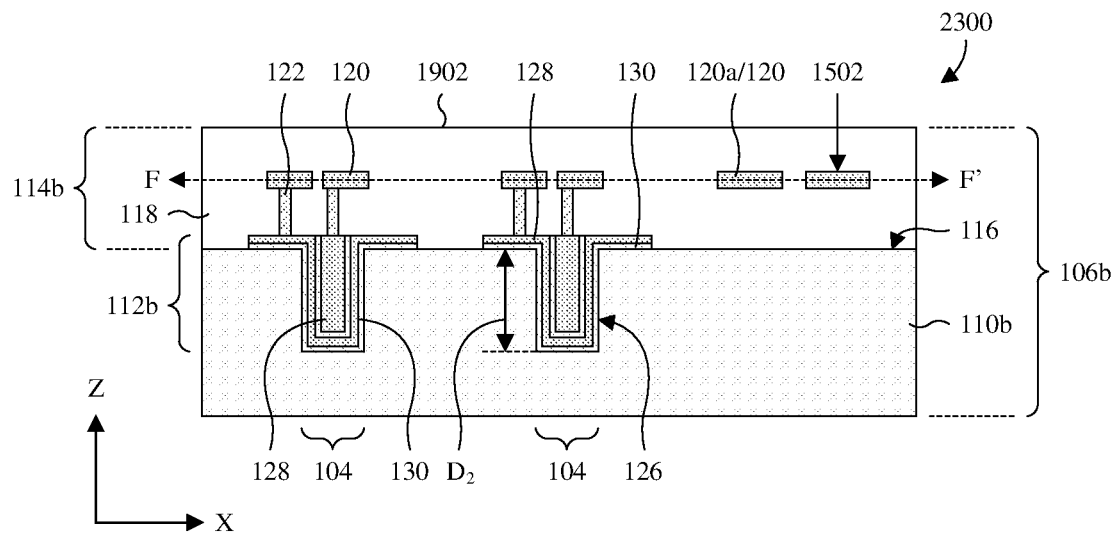

As illustrated by the cross-sectional views 2200, 2300 of FIGS. 22 and 23, a first IC die 106a (see, e.g., FIG. 22) and a second IC die 106b (see, e.g., FIG. 23) are respectively formed. A first device layer 112a is on a front side 116 of a first substrate 110a, whereas a second device layer 112b is on a front side 116 of a second substrate 110b. The first and second device layers 112a, 112b comprise corresponding 2D trench capacitors 126. The 2D trench capacitors 126 comprise corresponding capacitor electrodes 128 and corresponding capacitor dielectric layers 130 that are alternatingly stacked and that define trench segments 104. The trench segments 104 of the first IC die 106a extend into the first substrate 110a to a first depth $D_1$ and are wholly or substantially within the first substrate 110a. The trench segments 104 of the second IC die 106b extend into the second substrate 110b to a second depth $D_2$ and are wholly or substantially within the second substrate 110b. In some embodiments, the first depth $D_1$ is less than the second depth $D_2$ because the thickness T fs of the first substrate 110a may be limited by subsequently formed TSVs, as described above with regard to FIGS. 16 and 17.

A first interconnect structure 114a covers and electrically couples to the 2D trench capacitors 126 of the first IC die 106a on the front side 116 of the first substrate 110a. Similarly, a second interconnect structure 114b covers and electrically couples to the 2D trench capacitors 126 of the second IC die 106b on the front side 116 of the second substrate 110b. The first and second interconnect structures 114a, 114b comprise corresponding interconnect dielectric layers 118, as well as corresponding wires 120 and corresponding vias 122. The wires 120 and the vias 122 are alternatingly stacked in the interconnect dielectric layers 118 to define conductive paths electrically coupling the 2D trench capacitors 126 in parallel. Further, TSV wires 120a define pads 1502 to receive subsequently formed TSVs and electrically couple the pads 1502 to a remainder of the wires 120 and a remainder of the vias 122. The remainder of the wires 120 and the remainder of the vias 122, in turn, electrically couple the TSV wires 120a to terminals of the 2D trench capacitors 126. In some embodiments, the TSV wires 120a have the same top layout as in FIG. 2. For example, FIG. 2 may be taken along line E-E' and/or along line F-F'. In alternative embodiments, the TSV wires 120a have some other suitable top layout.

In some embodiments, the first and second IC dies 106a, 106b are symmetrical and/or are formed by the same process. Forming the first and second IC dies 106a, 106b by the same process may, for example, reduce manufacturing costs because there is only one process, instead of two separate processes, for the first and second IC dies 106a, 106b. Further, in some embodiments, the first and second IC dies 106a, 106b are individually formed by the process described at FIGS. 12-15, except that the first interconnect dielectric layer 118a at FIG. 14 is not formed and the wires 120 and the vias 122 have a different layout. As to the latter, wires are omitted at bond surfaces 1902 of the first and second IC dies 106a, 106b, such that the bond surfaces 1902 are limited to dielectric material. In alternative embodiments, the first IC die 106a and/or the second IC die 106b is/are formed by some other suitable process.

While the first IC die 106a is formed as illustrated as in FIG. 7, the first IC die 106a may alternatively be formed as illustrated in any one of FIGS. 8A-8E, 9A, and 9B. Similarly, while the second IC die 106b is formed as illustrated as in FIG. 7, the second IC die 106b may alternatively be formed as illustrated in any one of FIGS. 8A-8E, 9A, and 9B.

Figure 24:
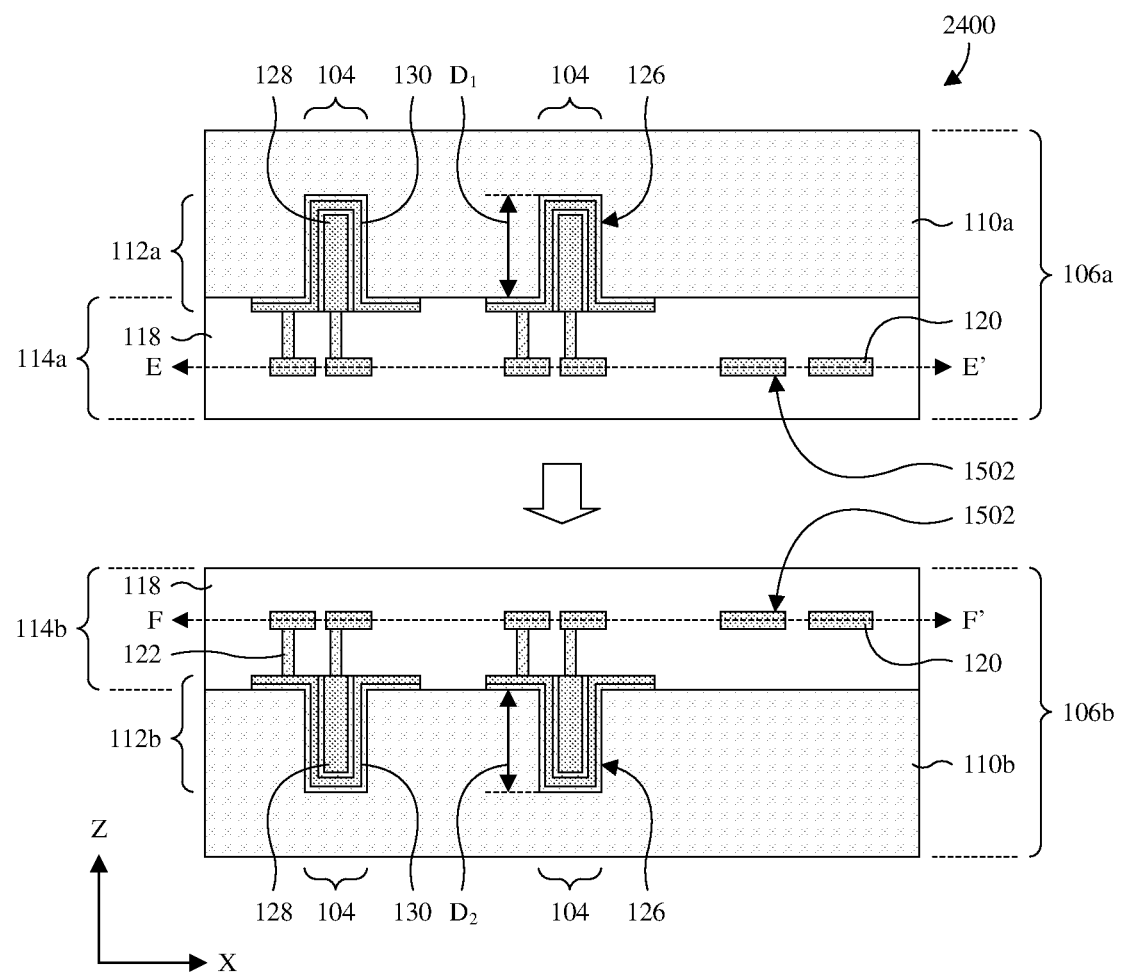

As illustrated by the cross-sectional view 2400 of FIG. 24, the first IC die 106a is vertically flipped. Further, the bond surfaces 1902 of the first and second interconnect structures 114a, 114b are pre-treated and coarsely aligned. In alternative embodiments, the course alignment and/or the pre-treatment is/are omitted. The pre-treatment may, for example, comprise a cleaning process, plasma treatment, some other suitable pre-treatment process(es) for fusion bonding, or any combination of the foregoing.

Also illustrated by cross-sectional view 2400 of FIG. 24, the bond surfaces 1902 are fusion bonded together. A process for performing the fusion bonding may, for example, comprise: 1) finely aligning the first IC die 106a to the second IC die 106b so the pads 1502 of the first IC die 106a respectively overlie and are aligned to the pads 1502 of the second IC die 106b; and 2) bringing the bond surfaces 1902 into direct contact. Other processes for performing the fusion bonding are, however, amenable.

Figure 25:
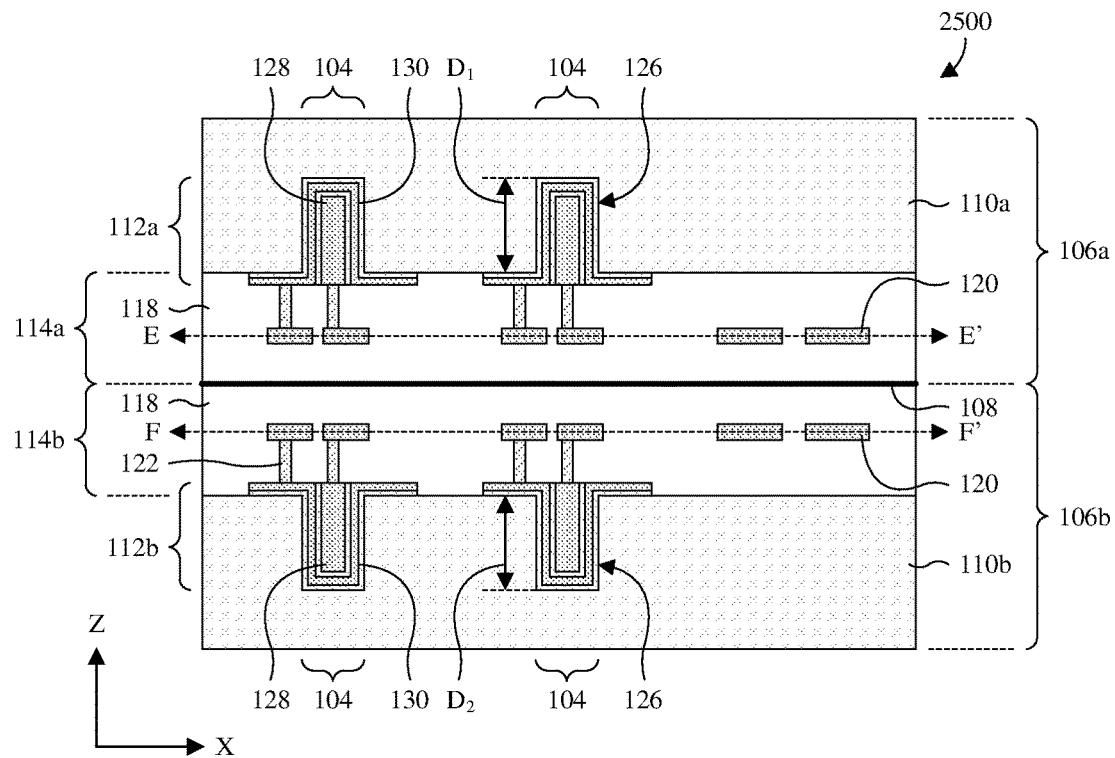

As illustrated by the cross-sectional view 2500 of FIG. 25, the first and second IC dies 106a, 106b are annealed to strength a front side bond interface 108 at which the first and second IC dies 106a, 106b directly contact. In contrast with FIG. 20, the 2D trench capacitors 126 of the first IC die 106a are not yet electrically coupled to each other.

Figure 26:
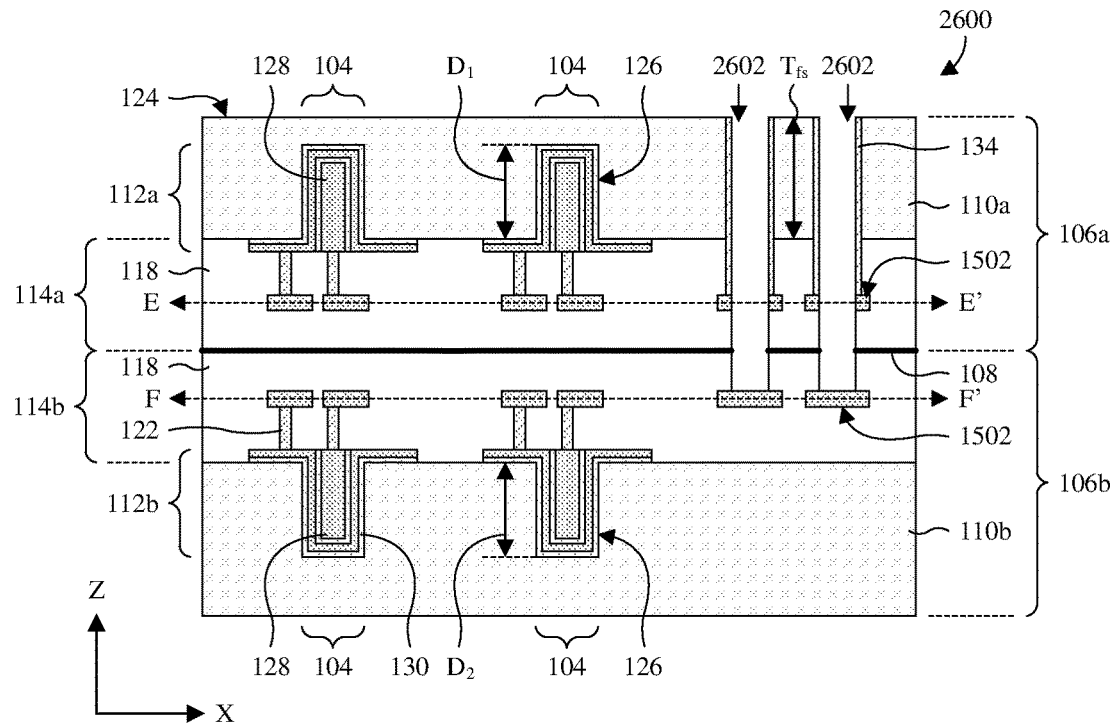

As illustrated by the cross-sectional view 2600 of FIG. 26, the first substrate 110a is thinned from a back side 124 of the first substrate 110a. The thinning reduces a thickness T fs of the first substrate 110a and may, for example, be performed by a CMP or some other suitable planarization. As described with regard to FIG. 16, the thinning may, for example, be performed to reduce an aspect ratio of subsequently formed TSVs and to mitigate challenges associated with high aspect ratios.

Also illustrated by the cross-sectional view 2600 of FIG. 26, the first and second IC dies 106a, 106b are patterned from the back side 124 of the first substrate 110a to form via openings 2602 extending through the pads 1502 of the first IC die 106a and respectively exposing the pads 1502 of the second IC die 106b. Further, TSV dielectric layers 134 are formed on sidewalls of the via openings 2602 at the first IC die.

A process for forming the via openings 2602 and the TSV dielectric layers 134 may, for example, comprise: 1) performing a photolithography/etching process into the back side 124 of the first substrate 110a until the pads 1502 of the first IC die 106a are reached; 2) depositing a dielectric layer over the first substrate 110a and further lining and partially filling the via openings 2602; 3) etching back the dielectric layer to expose the pads 1502 of the first IC die 106a and to form the TSV dielectric layers 134; and 4) performing an etching process through the pads 1502 of the first IC die 106a to the pads 1502 of the second IC die 106b. The TSV dielectric layers 134 may, for example, serve as a lateral etch stop during the etching at step 4). Notwithstanding the foregoing process for patterning the first and second IC dies 106a, 106b and forming the TSV dielectric layers 134, other processes are, however, amenable.

Figure 27:
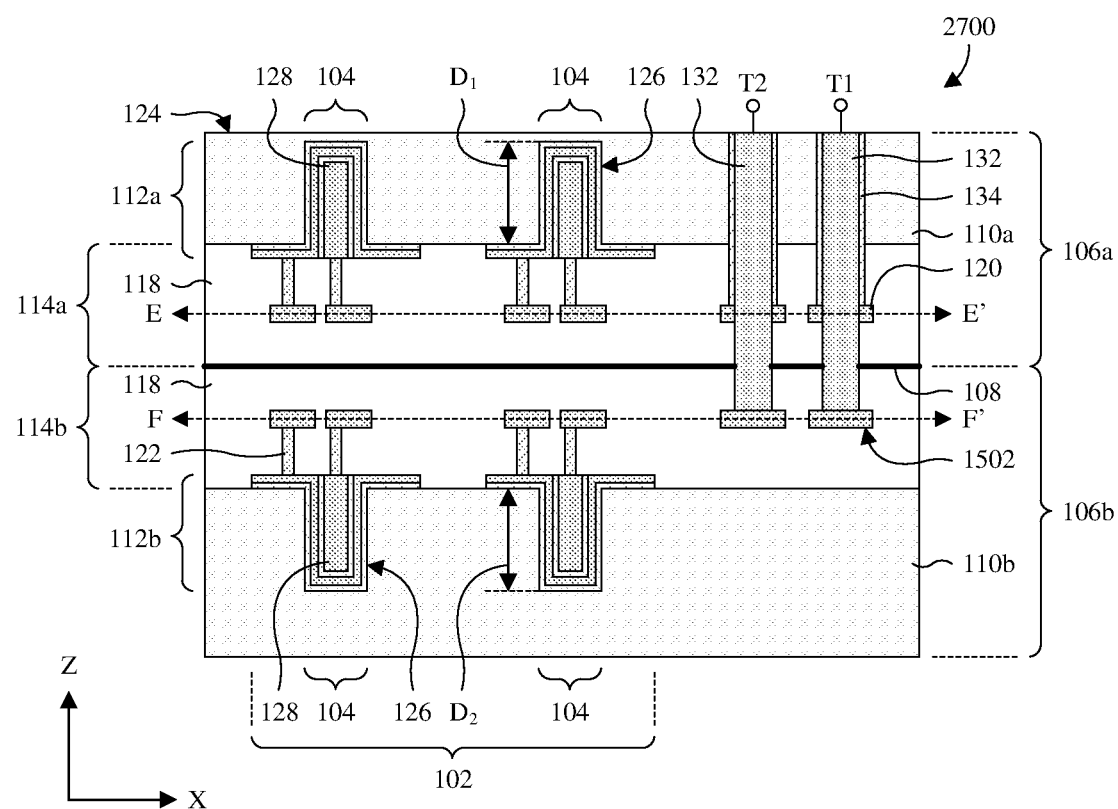

As illustrated by the cross-sectional view 2700 of FIG. 27, TSVs 132 are formed respectively in the via openings 2602 (see, e.g., FIG. 26). The TSVs 132 electrically couple the 2D trench capacitors 126 of the first IC die 106a in parallel with the 2D trench capacitors 126 of the second IC die 106b. Collectively, the 2D trench capacitors 126 of the first and second IC dies 106a, 106b define a 3D trench capacitor 102 having a first terminal $T_1$ and a second terminal $T_2$ accessible from the back side 124 of the first substrate 110a.

Because the 2D trench capacitors 126 are spread across the first and second device layers 112a, 112b in the vertical or Z dimension, the 3D trench capacitor 102 may have a small footprint. Further, because the capacitance of the 3D trench capacitor 102 is the sum of the capacitances of the 2D trench capacitors 126 in the first and second IC dies 106a, 106b, the 3D trench capacitor 102 may have a high capacitance. As a result of the high capacitance and the small footprint, the 3D trench capacitor 102 may have a high capacitance density. Additionally, because the first and second IC dies 106a, 106b are bonded together by fusion bonding and electrically coupled together by the TSVs 132, technical challenges associated with hybrid bonding (see, e.g., the method of FIGS. 12-21) may be avoided.

While FIGS. 22-27 are described with reference to various embodiments of a method, it will be appreciated that the structures shown in FIGS. 22-27 are not limited to the method but rather may stand alone separate of the method. While FIGS. 22-27 are described as a series of acts, it will be appreciated that the order of the acts may be altered in other embodiments. While FIGS. 22-27 illustrate and describe as a specific set of acts, some acts that are illustrated and/or described may be omitted in other embodiments. Further, acts that are not illustrated and/or described may be included in other embodiments.

Figure 28:
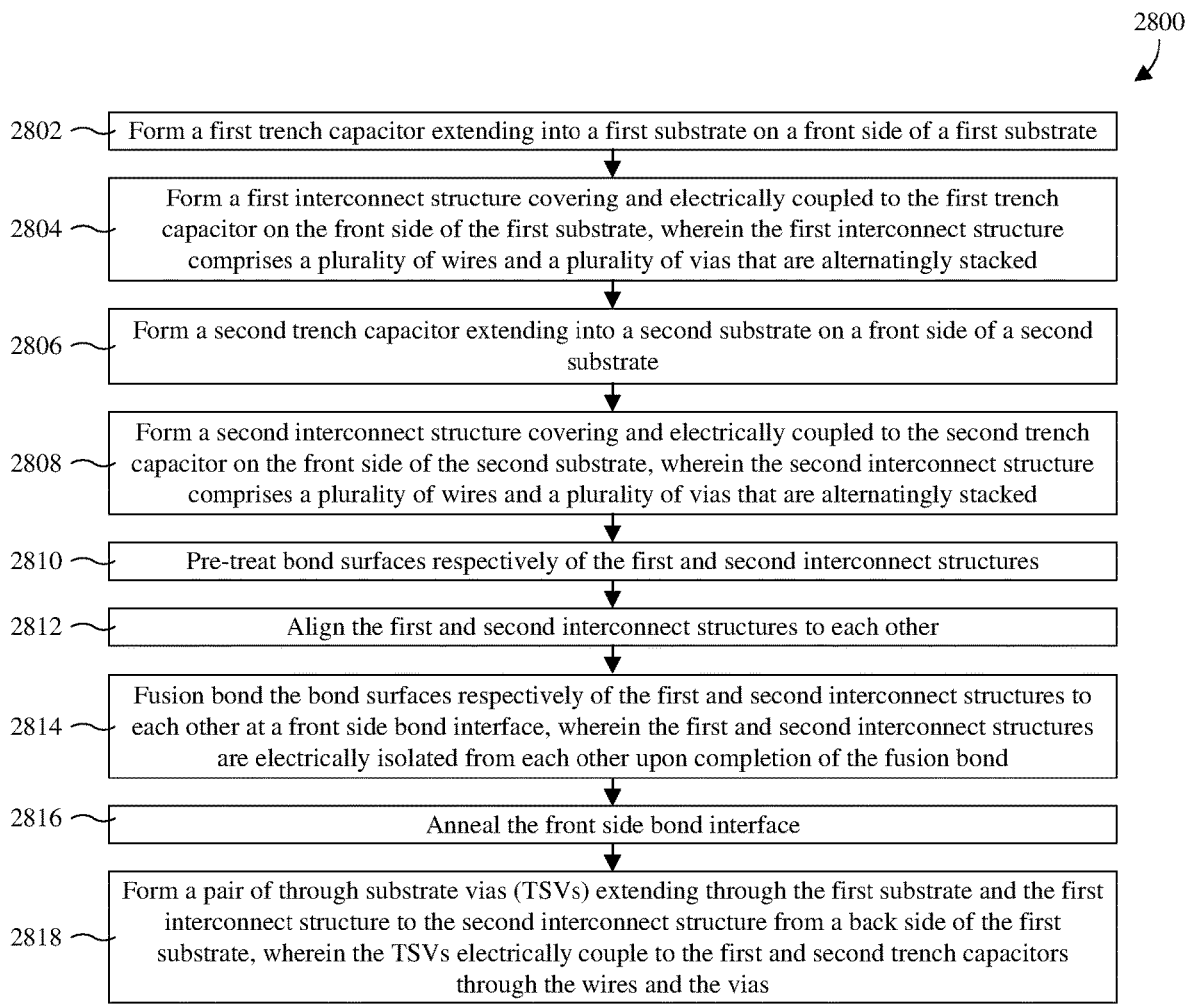
FIG. 28 illustrates a block diagram of some embodiments of the method of FIGS. 22-27.

With reference to FIG. 28, a block diagram 2800 of some embodiments of the method of FIGS. 22-27 is provided.

At 2802, a first trench capacitor is formed extending into a first substrate on a front side of a first substrate. See, for example, FIG. 22.

At 2804, a first interconnect structure is formed covering and electrically coupled to the first trench capacitor on the front side of the first substrate, wherein the first interconnect structure comprises a plurality of wires and a plurality of vias that are alternatingly stacked. See, for example, FIG. 22.

At 2806, a second trench capacitor is formed extending into a second substrate on a front side of a second substrate. See, for example, FIG. 23.

At 2808, a second interconnect structure is formed covering and electrically coupled to the second trench capacitor on the front side of the second substrate, wherein the second interconnect structure comprises a plurality of wires and a plurality of vias that are alternatingly stacked. See, for example, FIG. 23.

At 2810, bond surfaces respectively of the first and second interconnect structures are pre-treated. See, for example, FIG. 24.

At 2812, the first and second interconnect structures are aligned to each other. See, for example, FIG. 24.

At 2814, the bond surfaces respectively of the first and second interconnect structures are fusion bonded to each other at a front side bond interface, wherein the first and second interconnect structures are electrically isolated from each other upon completion of the fusion bond. See, for example, FIG. 24.

At 2816, the front side bond interface is annealed to strengthen the front side bond interface. See, for example, FIG. 25.

At 2818, a pair of TSVs are formed extending through the first substrate and the first interconnect structure to the second interconnect structure from a back side of the first substrate, wherein the TSVs electrically couple to the first and second trench capacitors through the wires and the vias. See, for example, FIGS. 26 and 27. Collectively, the first and second trench capacitors define a 3D trench capacitor. Because the 2D trench capacitors are spread across multiple substrates in the vertical or Z dimension, the 3D trench capacitor may have both a small footprint and a high capacitance. As a result of the high capacitance and the small footprint, the 3D trench capacitor may have a high capacitance density.

While the block diagram 2800 of FIG. 28 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a semiconductor structure including: a first substrate and a second substrate; a first trench capacitor and a second trench capacitor extending respectively into a front side of the first substrate and a front side of the second substrate, wherein the front sides of the first and second substrates face each other; a plurality of wires and a plurality of vias stacked between and electrically coupled to the first and second trench capacitors; and a first TSV extending through the first substrate from a back side of the first substrate opposite the front side of the first substrate, wherein the wires and the vias electrically couple the first TSV to the first and second trench capacitors. In some embodiments, the semiconductor structure further includes a first dielectric layer between the first trench capacitor and the first substrate, wherein the first trench capacitor extends completely through the first dielectric layer into the front side of the first substrate. In some embodiments, a thickness of the first dielectric layer is about equal to a difference between thicknesses of the first and second substrates. In some embodiments, the plurality of wires and the plurality of vias are grouped into a first alternating stack of wires and vias and a second alternating stack of wires and vias, and wherein the first and second alternating stacks are spaced from each other and electrically coupled together by the first TSV. In some embodiments, the plurality of wires and the plurality of vias define a first conductive path extending from the first TSV to the first trench capacitor and further define a second conductive path extending from the first TSV to the second trench capacitor, and wherein the first and second conductive paths are non-overlapping. In some embodiments, the plurality of wires and the plurality of vias are grouped into a first alternating stack of wires and vias and a second alternating stack of wires and vias, wherein the first and second alternating stacks directly contact at a hybrid bond interface, and wherein the first TSV extends through the first substrate, from the back side of the first substrate, and terminates between the hybrid bond interface and the first substrate. In some embodiments, the plurality of wires and the plurality of vias define a first conductive path extending from the first TSV to the first trench capacitor and further define a second conductive path extending from the first TSV to the second trench capacitor, and wherein the first and second conductive paths partially overlap. In some embodiments, the semiconductor structure further includes a second TSV extending through the first substrate from the back side of the first substrate, and wherein the wires and the vias electrically couple the second TSV to the first and second trench capacitors. In some embodiments, the first trench capacitor includes: a first electrode having a columnar profile; a capacitor dielectric layer wrapping around the first electrode and separating the first electrode from the first substrate; and a second electrode wrapping around the capacitor dielectric layer and separating the capacitor dielectric layer from the first substrate.

In some embodiments, the present disclosure provides an IC including: a first IC die including a first substrate, a first interconnect structure underlying the first substrate, and a first trench capacitor, wherein the first trench capacitor extends into the first substrate and is between the first substrate and the first interconnect structure; a second IC die under and directly bonded to the first IC die, wherein the second IC die includes a second substrate, a second interconnect structure overlying the second substrate, and a second trench capacitor, and wherein the second trench capacitor extends into the second substrate and is between the second substrate and the second interconnect structure; and a pair of TSVs extending through the first substrate and electrically coupled to the first and second trench capacitors by the first and second interconnect structures. In some embodiments, the TSVs are localized to the first IC die. In some embodiments, the TSVs extend completely through the first IC die and terminate in the second IC die, wherein the TSVs each directly contact sidewalls of first TSV wires in the first interconnect structure, and wherein the TSVs each directly contact and terminate at top surfaces of second TSV wires in the second interconnect structure.

In some embodiments, the present disclosure provides a method for forming a 3D trench capacitor, the method including: forming a first trench capacitor extending into a front side of a first substrate; forming a first interconnect structure covering and electrically coupled to the first trench capacitor on the front side of the first substrate; forming a second trench capacitor extending into a front side of a second substrate; forming a second interconnect structure covering and electrically coupled to the second trench capacitor on the front side of the second substrate; bonding the first and second interconnect structures together at a bond interface at which the first and second interconnect structures directly contact each other; and forming a first TSV extending through the first substrate from a back side of the first substrate, wherein the first TSV electrically couples to the first and second trench capacitors through the first and second interconnect structures. In some embodiments, the first and second trench capacitors are electrically coupled in parallel by the bonding. In some embodiments, the bonding is performed by a hybrid bonding process in which metal and dielectric material of the first interconnect structure respectively and directly contact metal and dielectric material of the second interconnect structure at the bond interface. In some embodiments, the method further includes: performing an etch into the back side of the first substrate before the bonding, wherein the etch forms an opening and stops on a TSV wire in the first interconnect structure; and filling the opening with a conductive material to define the first TSV in the opening. In some embodiments, the first and second trench capacitors are electrically isolated from each other upon completion of the bonding, and wherein the forming of the first TSV electrically couples the first trench capacitor to the second trench capacitor. In some embodiments, the bonding is performed by a fusion bonding process in which dielectric material of the first interconnect structure directly contacts dielectric material of the second interconnect structure at the bond interface, and wherein the bond interface is devoid of conductive material. In some embodiments, the method further includes: performing an etch into the back side of the first substrate after the bonding, wherein the etch forms an opening and stops on a TSV wire in the second interconnect structure; and filling the opening with a conductive material to define the first TSV in the opening. In some embodiments, the method further includes: depositing a dielectric layer on the front side of the first substrate; performing an etch into the dielectric layer and the first substrate from the front side of the first substrate to form a trench; forming a multi-layer capacitor film filling the trench; and patterning the multi-layer capacitor film into the first trench capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first substrate and a second substrate underlying the first substrate;
   a first trench capacitor and a second trench capacitor between the first and second substrates and extending respectively into the first and second substrates;
   a plurality of wires and a plurality of vias stacked between and electrically coupled to the first and second trench capacitors;
   a through substrate via (TSV) extending through the first substrate from a top of the first substrate to a bottom of the first substrate, wherein the plurality of wires and the plurality of vias electrically couple the TSV to the first and second trench capacitors; and
   a dielectric layer between the second trench capacitor and the second substrate, wherein the second trench capacitor extends completely through the dielectric layer into the second substrate.

2. The semiconductor structure according to claim 1, wherein the TSV is closer to the second substrate than the first trench capacitor.

3. The semiconductor structure according to claim 1, wherein the second substrate and the dielectric layer form a common sidewall, and wherein the second trench capacitor lines the common sidewall from top to bottom.

4. The semiconductor structure according to claim 1, wherein the second trench capacitor wraps around a corner of the dielectric layer from a sidewall of the dielectric layer to a top surface of the dielectric layer.

5. The semiconductor structure according to claim 1, wherein the second trench capacitor has a T-shaped profile.

6. The semiconductor structure according to claim 1, wherein the plurality of wires comprises a first wire and a second wire, wherein the first and second wires are at a common elevation and comprise individual pluralities of fingers that are interdigitated, and wherein the TSV extends to and terminates at the first wire.

7. The semiconductor structure according to claim 6, further comprising:
   a second TSV extending through the first substrate from the top of the first substrate to the second wire.

8. A semiconductor structure, comprising:
a substrate;
a first trench capacitor overlying and extending into the substrate; and
a plurality of wires and a plurality of vias alternatingly stacked over and electrically coupled to the first trench capacitor;
wherein the first trench capacitor comprises a bottom electrode, wherein the bottom electrode comprises a first surface recessed relative to a top surface of the substrate and a second surface elevated relative to the top surface of the substrate, and wherein the first and second surfaces face the substrate in a common direction extending parallel to a thickness of the substrate and are separated from each other in the common direction by a distance greater than the thickness.

9. The semiconductor structure according to claim 8, further comprising:
a dielectric layer directly between the second surface of the bottom electrode and the substrate, wherein the dielectric layer and the substrate have individual sidewalls facing the first trench capacitor, and wherein the individual sidewalls are vertically stacked and edge to edge.

10. The semiconductor structure according to claim 8, wherein the substrate has a sidewall facing and bordering the first trench capacitor, and wherein the sidewall has a height that is about 40-80 percent of the distance.

11. The semiconductor structure according to claim 8, wherein the first trench capacitor further comprises a top electrode overlying the bottom electrode, wherein the plurality of wires comprises a first wire and a second wire that are at a common elevation and that comprise individual pluralities of fingers that are interdigitated, and wherein the first and second wires are respectively electrically coupled to the top and bottom electrodes.

12. The semiconductor structure according to claim 11, further comprising:
a second trench capacitor overlying and extending into the substrate, wherein the second trench capacitor comprises a bottom electrode and a top electrode, and wherein the first and second wires are respectively electrically coupled to the top and bottom electrodes of the second trench capacitor.

13. The semiconductor structure according to claim 8, wherein the bottom electrode further comprises a sidewall facing the substrate and extending from the first surface of the bottom electrode to the second surface of the bottom electrode.

14. An integrated circuit (IC), comprising:
a first IC die comprising a first substrate, a first trench capacitor underlying the first substrate and recessed into a bottom of the first substrate, and a first interconnect structure underlying the first trench capacitor;
a second IC die under the first IC die, wherein the second IC die comprises a second substrate, a second trench capacitor overlying the second substrate and recessed into a top of the second substrate, and a second interconnect structure overlying the second trench capacitor, wherein the second interconnect structure directly contacts the first interconnect structure at a bond interface, which has a metal-to-metal portion and a dielectric-to-dielectric portion; and
a first through substrate via (TSV) extending through the first substrate and electrically coupled to the first and second trench capacitors by the first and second interconnect structures, wherein a bottom surface of the first TSV is elevated above the bond interface.

15. The IC according to claim 14, wherein the first interconnect structure comprises a first alternating stack of wires and vias, wherein the second interconnect structure comprises a second alternating stack of wires and vias, and wherein the first and second alternating stacks of wires have individual wires directly contacting at the bond interface to form the metal-to-metal portion of the bond interface.

16. The IC according to claim 14, wherein the first interconnect structure comprises a wire underlying and directly contacting the TSV and further comprises a via extending from the wire to the first trench capacitor.

17. The IC according to claim 14, wherein the first substrate has a thickness less than a thickness of the second substrate, and wherein the first trench capacitor has a height greater than or equal to a height of the second trench capacitor.

18. The IC according to claim 14, wherein a vertical separation between the first substrate and a bottom surface of the first trench capacitor is greater than a vertical separation between the second substrate and a top surface of the second trench capacitor.

19. The IC according to claim 14, further comprising:
a second TSV extending through the second substrate and electrically coupled to the first and second trench capacitors by the first and second interconnect structures, wherein a top surface of the second TSV is recessed relative to the bond interface.

20. The IC according to claim 14, further comprising:
a second TSV extending through the first substrate and electrically coupled to the first and second trench capacitors by the first and second interconnect structures, wherein the second TSV extends through the first substrate, from an upper side of the first substrate, and terminates between the bond interface and the first substrate.

* * * * *